(12) United States Patent
Yoshida

(10) Patent No.: US 10,937,814 B2
(45) Date of Patent: Mar. 2, 2021

(54) WIRING BOARD AND DISPLAY DEVICE INCLUDING METAL LINE WITH REDUNDANT STRUCTURE AND REDUCED WIRING RESISTANCE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 16/383,873

(22) Filed: Apr. 15, 2019

(65) Prior Publication Data
US 2019/0319052 A1    Oct. 17, 2019

(30) Foreign Application Priority Data

Apr. 16, 2018    (JP) .............................. JP2018-078428

(51) Int. Cl.
*H01L 27/12*    (2006.01)
*G02F 1/1368*    (2006.01)
(Continued)

(52) U.S. Cl.
CPC ........ *H01L 27/1244* (2013.01); *G02F 1/1368* (2013.01); *G02F 1/13338* (2013.01); *G02F 1/136259* (2013.01); *G02F 1/136286* (2013.01); *G06F 3/0443* (2019.05); *G02F 1/13394* (2013.01); *G02F 1/134363* (2013.01); *G02F 2001/136272* (2013.01)

(58) Field of Classification Search
CPC .... G06F 1/1626; G06F 1/1637; G06F 1/1641; G06F 1/1652; G06F 1/1681; G06F 3/0443; G06F 3/0412; G06F 3/04164; H01L 27/1244; H01L 27/1248; G02F 1/1368; G02F 1/136286; G02F 1/136259; G02F 1/13338; G02F 1/13394; G02F 2001/136272; G02F 1/134363; G02F 2201/508; G02F 2001/13629; G02F 2201/506
USPC ......................................................... 257/72
See application file for complete search history.

(56) References Cited

U.S. PATENT DOCUMENTS

| 6,429,909 B1 | 8/2002 | Kim et al. |
| 2002/0158996 A1 | 10/2002 | Kim et al. |

(Continued)

FOREIGN PATENT DOCUMENTS

JP    11-194369 A    7/1999

*Primary Examiner* — Duy T Nguyen
(74) *Attorney, Agent, or Firm* — Keating & Bennett, LLP

(57) ABSTRACT

An array substrate includes gate lines made of a first metal film, source lines made of a second metal film disposed such that a gate insulating film is interposed between the second metal film and the first metal film, the source lines extending to intersect the gate lines, auxiliary lines made of the first metal film, the auxiliary lines being arranged such that a pair of auxiliary lines sandwich the gate line therebetween and extending in parallel with the source lines to at least partly overlap the source lines, respectively, and bridge lines made of a third metal film disposed such that a first inter-layer film located opposite to the gate insulating film is interposed between the third metal film and the second metal film, the bridge lines being arranged to lie astride the gate lines, respectively, to electrically connect the source lines to pairs of the auxiliary lines.

14 Claims, 18 Drawing Sheets

(51) Int. Cl.
*G02F 1/1362* (2006.01)
*G06F 3/044* (2006.01)
*G02F 1/1333* (2006.01)
G02F 1/1339 (2006.01)
G02F 1/1343 (2006.01)

(56) References Cited

U.S. PATENT DOCUMENTS

2004/0141099 A1 7/2004 Kim et al.
2013/0077034 A1* 3/2013 Jung .................. G02F 1/13452
                                                                349/122
2016/0246130 A1* 8/2016 Li .......................... H01L 21/443
2018/0246596 A1* 8/2018 Takada ................. G06F 3/0446
2019/0319052 A1* 10/2019 Yoshida ............. G06F 3/04164

* cited by examiner

WIRING BOARD AND DISPLAY DEVICE INCLUDING METAL LINE WITH REDUNDANT STRUCTURE AND REDUCED WIRING RESISTANCE

CROSS REFERENCE TO RELATED APPLICATION

This application claims priority from Japanese Patent Application No. 2018-78428 filed on Apr. 16, 2018. The entire contents of the priority application are incorporated herein by reference.

TECHNICAL FIELD

The technology described herein relates to a wiring board and a display device.

BACKGROUND

A technology described in Japanese Unexamined Patent Application Publication No. 11-194369 has been known as an example of a liquid crystal display device. The liquid crystal display device described in Japanese Unexamined Patent Application Publication No. 11-194369 includes a transparent insulating substrate, gate lines formed to extend in a first direction on the insulating substrate, auxiliary repair lines formed to extend in a second direction in the same layer in which the gate lines are formed, the auxiliary repair liens being made of the same material making up the gate lines and composed of a number of parts separated by the gate lines serving as boundaries, a first insulating layer covering the gate lines and the auxiliary repair lines, and data lines formed on the first insulating layer along the auxiliary repair lines to extend in the second direction.

SUMMARY

According to the liquid crystal display device described in Japanese Unexamined Patent Application Publication No. 11-194369, an auxiliary repair line structure can be achieved, which allows reducing wire-breaking failures of the date lines without carrying out an additional process. However, an auxiliary repair line used to repair a broken date line is made of the same transparent electrode film making up a pixel electrode. Compared with a metal film making up the gate lines and date lines, the transparent electrode film is a film with high sheet resistance. For this reason, repairing a broken data line using an auxiliary repair line made of the transparent electrode film may lead to such a case where the wiring resistance of the broken data line subjected to the repair work becomes higher than that of a data line not subjected to the repair work. In the case of an in-cell type liquid crystal display device having a touch panel function, a writing-in period in which a data signal is transmitted to a data line becomes shorter because of a sensing period for exerting the touching panel function. This leads to a problem that display quality tends to deteriorate easily as a result of a voltage drop that occurs at the data signal transmitted to the data line.

The technology described herein was made in view of the above circumstances. An object is to reduce the wiring resistance of a second line.

A wiring substrate according to the technology described herein includes a first line made of a first metal film, a second line made of a second metal film disposed such that a first insulating film is interposed between the second metal film and the first metal film, the second line extending in such a way as to intersect the first line, auxiliary lines made of the first metal film, the auxiliary lines being arranged to sandwich the first line therebetween and extending in parallel with the second line in such a way as to at least partly overlap the second line, and a bridge line made of a third metal film disposed such that a second insulating film located opposite to the first insulating film is interposed between the third metal film and the second metal film, the bridge line being arranged in such a way as to lie astride the first line to electrically connect the second line to the auxiliary lines.

In this configuration, the second line, which intersect the first line made of the first metal film, is made of the second metal film disposed such that the first insulating film is interposed between the second film and the first film. This prevents the second line from being short-circuited to the first line. The auxiliary line, which is made of the same first metal filmmaking up the first line and extends in parallel with the second line in such a way as to at least partly overlap the second line via the first insulating film, is arranged such that the first line is sandwiched between a pair of the auxiliary lines. This prevents the auxiliary line from being short-circuited to the first line. The bridge line, which is arranged in such a way as to lie astride the first line, is made of the third metal film disposed such that the second insulating film located opposite to the first insulating film is interposed between the third film and the second film. This prevents the bridge line from being short-circuited to the first line. Because the bridge line electrically connects the second line to the pair of auxiliary lines sandwiching the first line therebetween, a signal transmitted to the second line is transmitted also to the pair of auxiliary lines and to the bridged line. Even if the second line is broken, therefore, signal transmission is maintained. This improves the redundant structure of the second line and reduces the wiring resistance of the second line, in which case a voltage drop hardly occurs at the transmitted signal. In addition, because the pair of auxiliary lines and the bridge line are made of the first metal film and the third metal film, respectively, in comparison with a conventional case where an auxiliary repair line made of a transparent electrode film is used, the wiring resistance of the pair of auxiliary lines and the bridge line can be reduced. Further, the pair of auxiliary lines being made of the same first metal film making up the first line offers an advantage for a reduction in production cost.

According to the technology described herein, the wiring resistance of the second line can be reduced.

DETAILED DESCRIPTION

First Embodiment

A first embodiment according to the present technology will be described with reference to FIGS. 1 to 10. In the first embodiment, a liquid crystal display device 10 (display device with a position input function) having a display function and a touch panel function (position input function) will be described. Apart of each of the drawings has the X-axis, the Y-axis, or the Z-axis described therein such that the X-axis, the Y-axis, or the Z-axis points the same X-axis direction, Y-axis direction, or Z-axis direction, respectively, in each drawing. The upper side in FIGS. 3, 6, 9 and 10 is defined as a front side and the lower side in the same as a back side.

Figure 1:
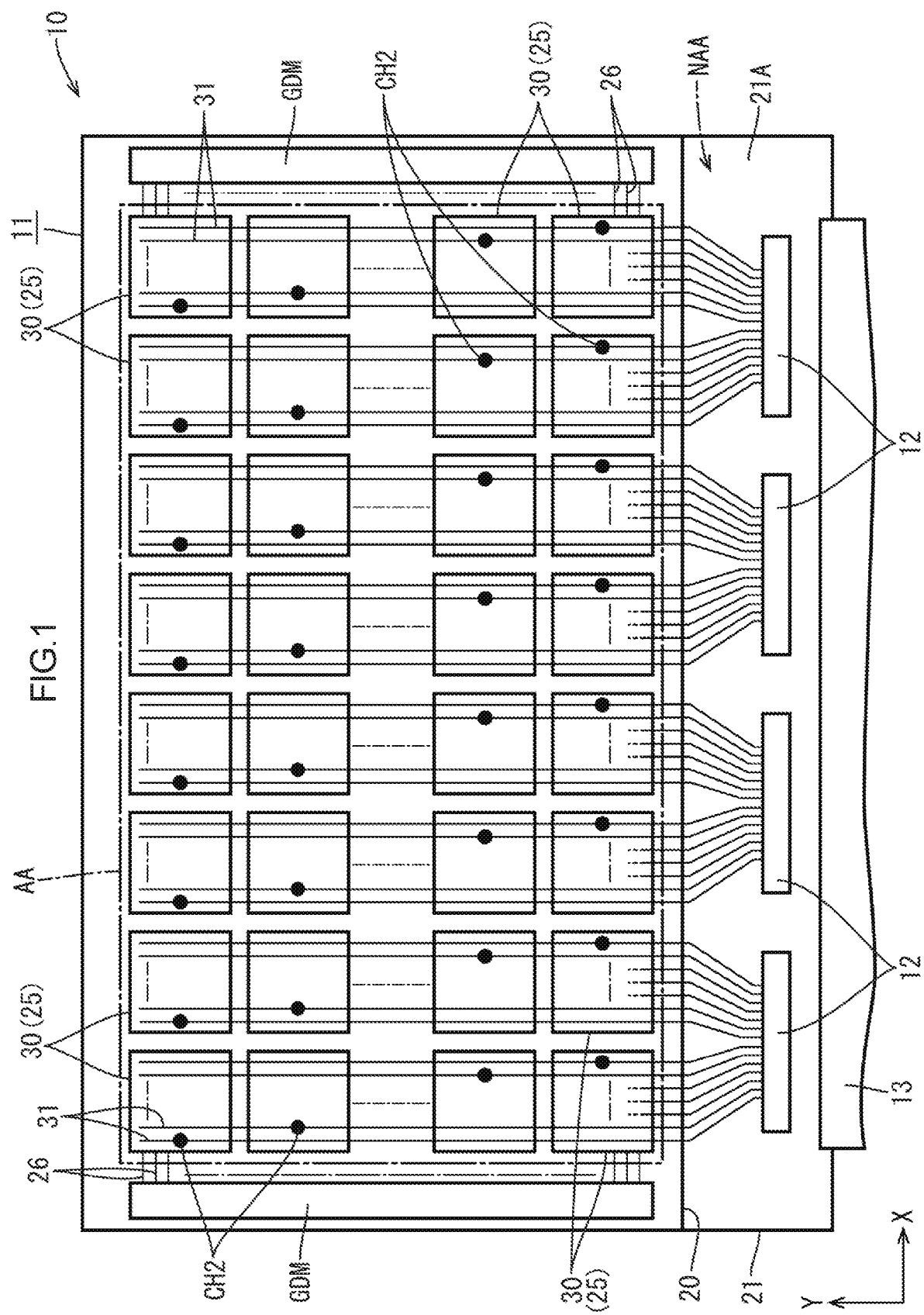
FIG. 1 is a plan view of touch electrodes, touch lines, and the like of a liquid crystal panel included in a liquid crystal display device according to a first embodiment.

FIG. 1 is a schematic plan view of a liquid crystal panel 11. As shown in FIG. 1, the liquid crystal display device 10 is of a laterally elongated rectangle, and includes at least the liquid crystal panel (display device, display panel, or display panel with the position input function) 11 configured to display an image, and a backlight unit (lighting device) serving as an external light source that emits light onto the liquid crystal panel 11 for displaying an image. According to this embodiment, the liquid crystal panel 11 has a screen size of, for example, about 16 inches (specifically, 16.1 inches) and offers resolution performance equivalent to "FHD". The backlight unit is disposed on the back side (rear side) of the liquid crystal panel 11, and has light sources, such as LEDs, that emit white light and an optical member that acts optically on light from the light sources to transform the light into a planar beam of light.

As shown in FIG. 1, on the liquid crystal panel 11, a central part of its screen serves as a display area AA (range indicated by a single-dot chain line in FIG. 1) in which an image is displayed. In contrast, a frame-shaped peripheral part of the screen of the liquid crystal panel 11, the peripheral part encircling the display area AA, serves as a non-display area NAA in which no image is displayed. The liquid crystal panel 11 is constructed by pasting together a pair of substrates 20 and 21. One of the pair of substrates 20 and 21 that is on the front side is a CF substrate (counter substrate) 20, and the other on the back side (rear side) is an array substrate (wiring board, active matrix, or element substrate) 21. Each of the CF substrate 20 and the array substrate 21 is formed by stacking various films on the inner surface of a glass substrate. On the outer surfaces of the substrates 20 and 21, polarizers are pasted, respectively. The CF substrate 20 is smaller in short side dimension than the short side dimension of array substrate 21, and is pasted to the array substrate 21 such that one end of the CF substrate 20 in the direction of short sides (Y-axis direction) is matched to the corresponding one end of the array substrate 21. As a result, the other end of the array substrate 21 in the direction of short sides projects sidewise relative to the CF substrate 20, creating a CF substrate non-overlapping section 21A where the array substrate 21 does not overlap the CF substrate 20. The CF substrate non-overlapping section 21A carries drivers 12 (drive circuits) that supplies various signals related to the display function and the touch panel function, which will be described later, and a flexible board 13 (signal transmitting portion). Each driver 12 is composed of an LSI chip having a built-in drive circuit, is mounted on the array substrate 21 by a chi-on-glass (COG) method, and processes various incoming signals from the flexible board 13. According to this embodiment, four drivers 12 are lined up at intervals in the X-axis direction in the non-overlapping area NAA of the liquid crystal panel 11. The flexible board 13 is constructed by forming a number of wiring patterns on a base material made of a synthetic resin material (e.g., polyimide-based resin) having insulation property and flexibility. The flexible board 13 has on end connected to the non-display area NAA of the liquid crystal panel 11 and the other end connected to a control board (signal supply). Various signals supplied from the control board travels through the flexible board 13 to the liquid crystal panel 11, where the signals are processed by the drivers 12 in the non-display area NAA and are output to the display area AA. In the non-display area NAA of the array substrate 21, a pair of gate circuits GDM are disposed such that they sandwich the display area AA from both sides in the X-axis direction. The gate circuits GDM are circuits for supplying scanning signals to gate lines 26, which will be described later.

The liquid crystal panel 11 according to this embodiment has the display function of displaying images and the touch panel function of detecting a user's input position (input position) based on a displayed image. The liquid crystal panel 11 has a touch panel pattern for exerting the touch panel function in the form of an integrated pattern (in-cell pattern). The touch panel pattern is a so-called reflective capacitance-sensing touch panel pattern and detects a touch by a self-capacitance method. As shown in FIG. 1, the touch panel pattern is made up of a matrix of touch electrodes (position detecting electrodes) 30 arranged on a plate surface of the liquid crystal panel 11. The touch electrodes 30 are located in the display area AA of the liquid crystal panel 11. The display area AA of the liquid crystal panel 11, therefore, substantially matches a touch area (position input area) where an input position can be detected, while the non-display area NAA substantially matches a non-touch area (position non-input area) where an input position cannot be detected. When the user intends to make position input based on an image the user recognizes in the display area AA of the liquid crystal panel 11 and moves a finger (position input object), which is a conductor, closer to the surfaced (display surface) of the liquid crystal panel 11, capacitance is created between the finger and a touch electrode 30. The capacitance detected by the touch electrode 30 close to the finger changes as the finger moves closer to the touch electrode 30 and therefore becomes different from capacitance detected by a touch electrode 30 located distant from the finger. Based on this capacitance change, an input position can be detected. The touch electrodes 30 are arranged such that in the display area AA, rows of touch electrodes 30 are lined up at intervals in the X-axis direction (direction in which rows of pixel electrodes 24 are lined up to sandwich lows of touch lines 31 therebetween) and in the Y-axis direction (direction in which the touch lines 31 extend) to form a matrix pattern. In a plan view, each touch electrode 30 is substantially of a square whose one side is several mm (e.g., 2 mm to 6 mm). The touch electrode 30 thus has a size in a plan view much larger than that of a pixel PX, which will be described later, and therefore occupies a range that covers, for example, scores of pixels PX in the X-axis and Y-axis directions. To the touch electrodes 30, the touch lines (third lines or position detection lines) 31 included in the liquid crystal panel 11 are connected selectively. The touchlines 31 extend in the Y-axis direction and are connected selectively to specific touch electrodes 30 among rows of the touch electrodes 30 lined up in the Y-axis direction. In FIG. 1, spots at which touch lines 31 are connected to touch electrodes 30 (spots at which touch line contact holes, which will be described later, are formed) are represented by black circles. The touch lines 31 are connected also to detection circuits. The detection circuits may be included in the drivers 12 or may be disposed outside the liquid crystal panel 11 via the flexible board 13. FIG. 1 diagrammatically depicts arrangement of the touch electrodes 30, and the concrete number, arrangement, and plane shape of the touch electrodes 30 may be changed properly to be different from those indicated in FIG. 1.

Figure 2:
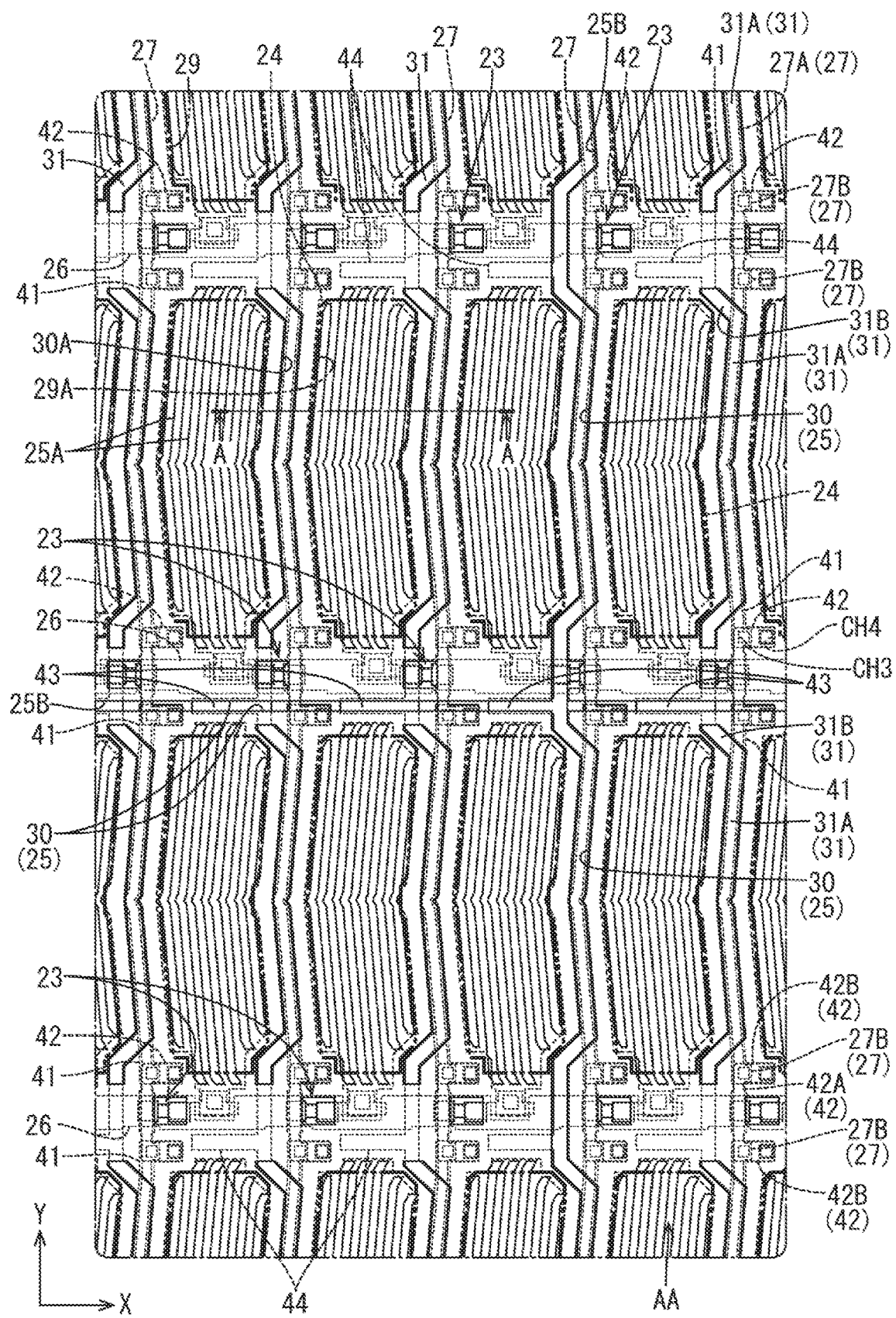
FIG. 2 is a plan view of arrangement of pixels of the liquid crystal panel.

FIG. 2 is a plan view of a part of the array substrate 21 making up the liquid crystal panel 11, the part being in the display area AA. As shown in FIG. 2, each touch electrode 30 has a touch line overlapping opening (line overlapping opening or position detection line overlapping opening) 30A overlapping a part of each touch line 31. Each touch line overlapping opening 30A extends in parallel with the Y-axis direction in which the touch line 31 extends, and is of a vertically elongated shape (rectangle whose longitudinal direction matches the direction of extension of the touch line 31) in a plan view. The touch line overlapping opening 30A is larger in width dimension (dimension in the X-axis direction) than the touch line 31. In this manner, the touch line overlapping openings 30A are arranged such that each touch line overlapping opening 30A overlaps at least a part of each touch line 31. This arrangement reduces parasitic capacitance created between the touch line 31 and a touch electrode 30 not connected to the touch line 31, thus offering better sensitivity in position detection.

As shown in FIG. 2, on the inner surface side of the array substrate 21 making up the liquid crystal panel 11, the inner surface side being in the display area AA, thin-film transistors (TFTs) 23 (switching elements) and the pixel electrodes 24 are arranged. A number of the TFTs 23 and of the pixel electrodes 24 are arranged at intervals in the X-axis direction and the Y-axis direction to form a matrix pattern. Around these TFTs 23 and pixel electrodes 24, gate lines (first lines or scanning lines) 26 and source lines (second lines, signal lines, or data lines) 27 are arranged such that the gate lines 26 and the source lines 27 intersect each other. The gate lines 26 substantially extend in the X-axis direction, while the source lines 27 substantially extend in the Y-axis direction. The gate lines 26 and the source lines 27 are connected to the gate electrodes 23A of the TFTs 23 and the source electrodes 23B of the TFTs 23, respectively, and the pixel electrodes 24 are connected to the drain electrodes 23C of the TFTs 23.

The TFTs 23 are driven based on various signals supplied to the gate lines 26 and to the source lines 27, and the driven TFTs 23 control supply of voltage to the pixel electrodes 24. The TFTs 23 are located on the left-hand side or on the right-hand side relative to the pixel electrodes 24 (source lines 27) in the X-axis direction in FIG. 2. Rows of TFTs 23 located on the left-hand side relative to pixel electrodes 24 (source lines 27) and rows of TFTs 23 located on the right-hand side relative to pixel electrodes 24 (source lines 27) are arranged alternately in the Y-axis direction. The TFTs 23 are thus arranged in a zigzag pattern in a plan view. In its plane shape, each pixel electrode 24 is substantially a vertically elongated rectangle (with its long sides, specifically, bent along the source line 27). The pixel electrode 24 has short sides extending in the direction in which the gate line 26 extends and long sides extending in the direction in which the source line 27 extends. The pixel electrode 24 is sandwiched between a pair of gate lines 26 lying on both sides in the Y-axis direction and between a pair of source lines 27 lying on both sides in the X-axis direction. It can be said, therefore, that a gate line 26 and a pixel 24 interconnected through a TFT 23 make a pair, and such pairs of gate lines 26 and pixels 24 are lined up in the Y-axis direction. In the same manner, a source line 27 and a pixel 24 interconnected through a TFT 23 make a pair, and such pairs of source lines 27 and pixels 24 are lined up in the X-axis direction. On the CF substrate 20 side, a black matrix (inter-pixel shading portion) 29 is formed, which is indicated by two-dot chain lines in FIG. 2. In its plane shape, the black matrix 29 is substantially a latticed shape that partitions pixel electrodes 24 adjacent to each other, and has pixel openings 29A located such that each pixel opening 29A overlaps most of each pixel electrode 24. These pixel openings 29A allow light passing through the pixel electrodes 24 to come out of the liquid crystal panel 11. The black matrix 29 is disposed such that, in a plan view, it overlaps at least the gate lines 26 and the source lines 27 (including the touch lines 31) on the array substrate 21 side. Arrangement of the TFTs 23 and the pixel electrodes 24 will be described later.

Figure 3:
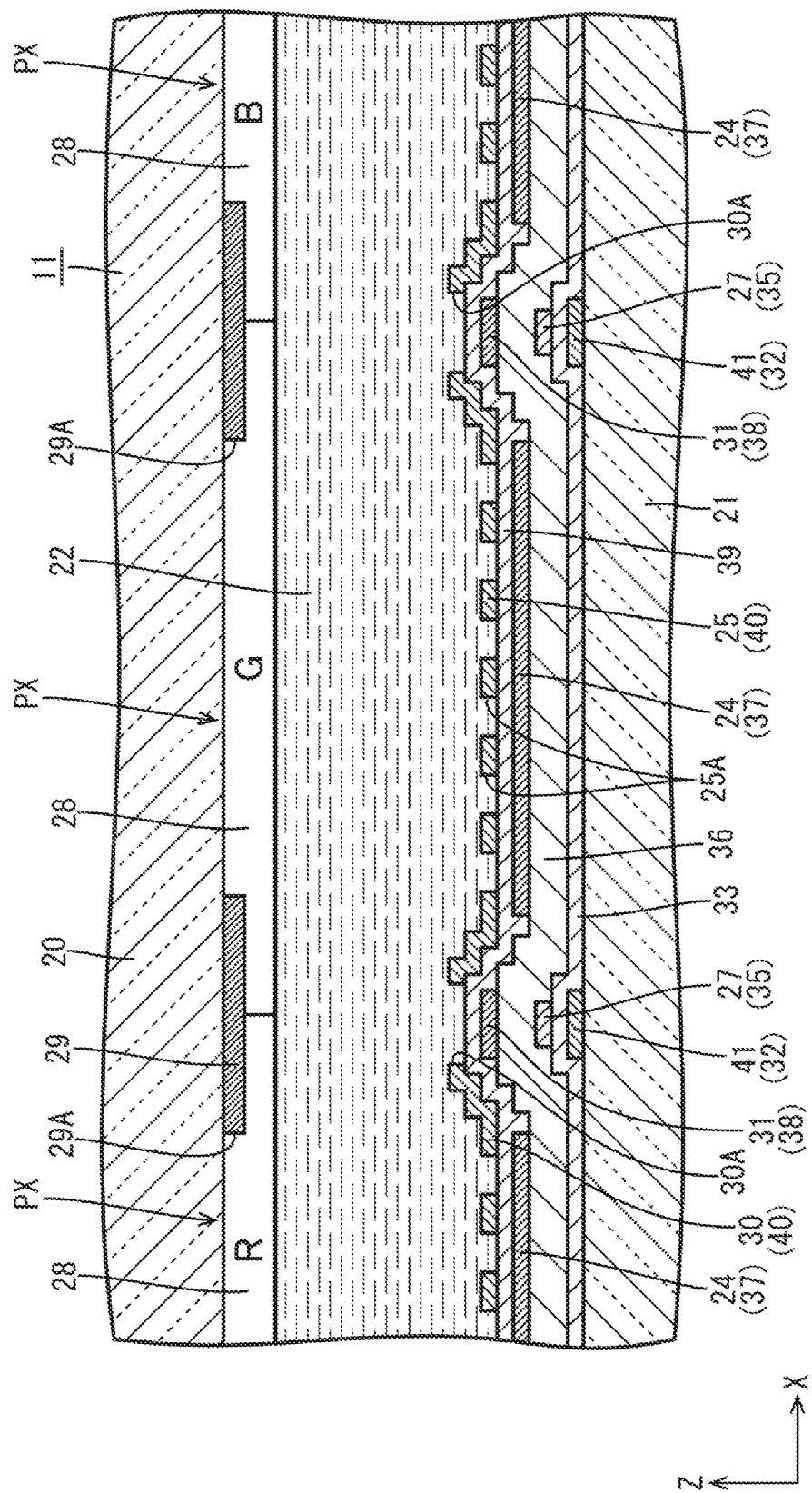
FIG. 3 is a sectional view of the liquid crystal panel of FIG. 2 that is taken along an A-A line in FIG. 2.

FIG. 3 is a sectional view of the vicinity of a central part of a pixel PX of the liquid crystal panel 11. As shown in FIG. 3, the liquid crystal panel 11 includes a liquid crystal layer (medium layer) 22 placed between the pair of substrates 20 and 21 and containing liquid crystal molecules, which are a substance that is changed in optical characteristics when exposed to an electric field. According to this embodiment, spacers are provided between the pair of substrates 20 and 21 to maintain a gap between the substrates 20 and 21. In the display area AA on the inner surface side of the CF substrate 20 making up the liquid crystal panel 11, color filters 28 of three colors, i.e., blue (B), green (G), and red (R) are arranged. A number of sets of color filters 28 of different colors are arranged repeatedly along the gate lines 26 (X-axis direction) and extend along the source lines 27 (extend substantially along the Y-axis direction). The color filters 28 as a whole are thus arranged in strip patterns. Each of the color filters 28 overlaps each of the pixel electrodes 24 on the array substrate 21 side in a plan view. A boundary (color boundary) between each pair of color filters 28 adjacent to each other and different in color from each other in the X-axis direction overlaps each source line 27 and the black matrix 27. In this liquid crystal panel 11, a set of color filters 28 of R, G, and B arranged in the X-axis direction and a set of three pixel electrodes 24 each counter to each of the color filters 28 make up a set of pixels PX of three colors. In the liquid crystal panel 11, a set of pixels PX of three colors R, G, and B adjacent to each other in the X-axis direction make up a display pixel that displays a given color tone. A pitch of arrangement of pixels PX in the X-axis direction is determined to be, for example, about 60 μm (specifically, 62 μm), and the same of pixels PX in the Y-axis direction is determined to be, for expel, about 180 μm (specifically, 186 μm). The black matrix 29 is disposed in such a way as to partition adjacent color filters 28 from each other. On the upper layer side (side closer to the liquid crystal layer 22) to the color filters 28, a flattening layer is provided as a solid layer substantially covering the whole of the CF substrate 20. The innermost surfaces of the substrates 20 and 21, the innermost surfaces being in contact with the liquid crystal layer 22, are overlaid respectively with orientation films for orienting liquid crystal molecules included in the liquid crystal layer 22.

Figure 4:
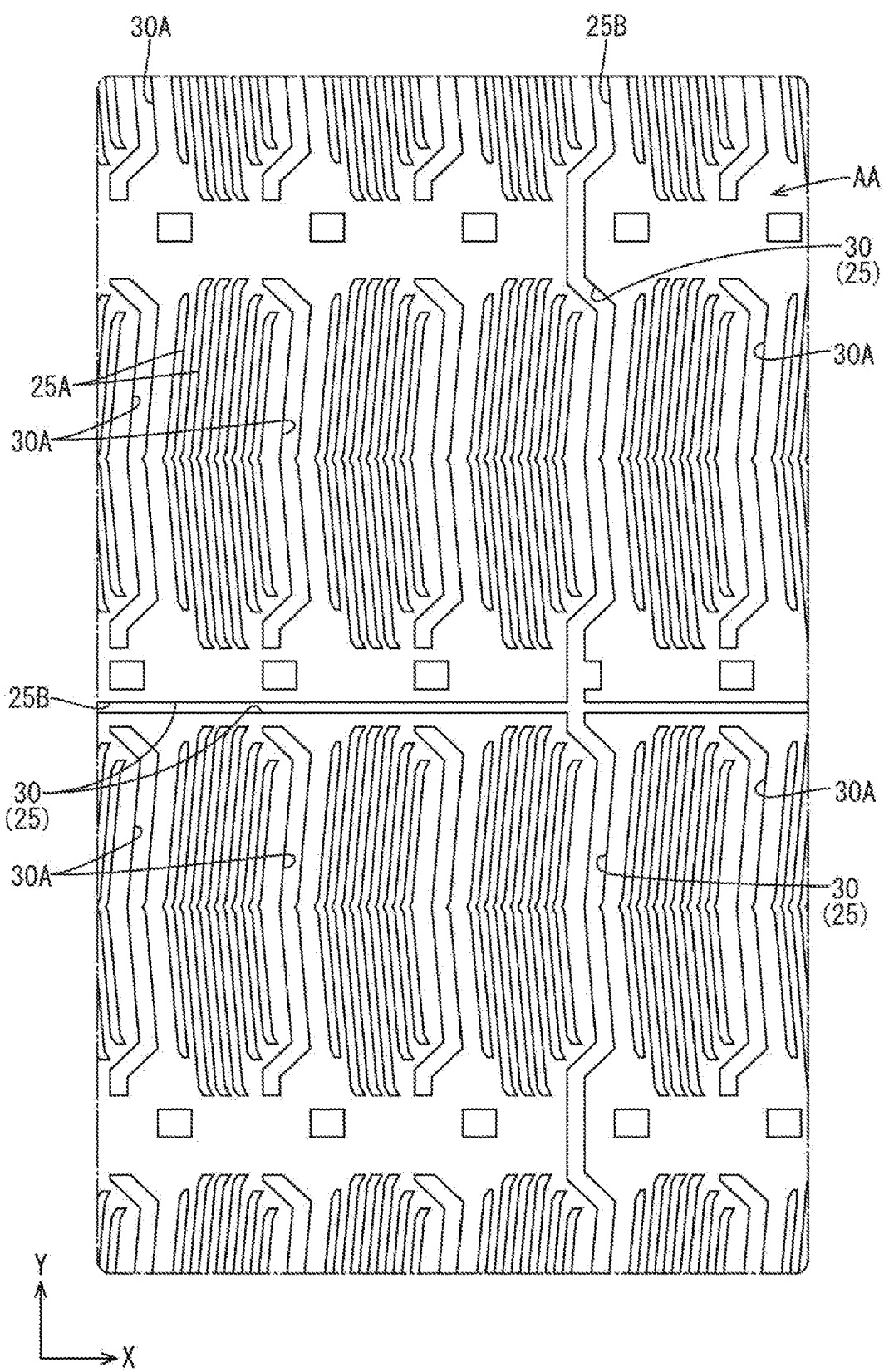
FIG. 4 is a plan view of a pattern of a second transparent electrode film included in an array substrate.

The common electrode 25 will then be described with reference to FIGS. 2 to 4. FIG. 4 is a plan view of a pattern of the common electrode 25 (second transparent electrode film 40, which will be described later) included in the array substrate 21. As shown in FIGS. 2 to 4, on the inner surface side of the array substrate 21 in the display area AA, the common electrode 25 is formed on the upper layer side to the pixel electrodes 24 such that the common electrode 25 overlaps all the pixel electrodes 24. The common electrode 25 is constantly supplied with a reference voltage of substantially a constant voltage level, except a period (sensing period) in which a touch signal (signal or position detection signal) is supplied and the input position of input made by the finger, which is the position input object, is detected, and extends to substantially cover the whole of the display area AA. On a part of common electrode 25 that overlaps each pixel electrode 24 (specifically, each pixel electrode body 24A, which will be descried later), pixel overlapping openings (pixel overlapping slits or orientation control slits) 25A are formed such that they extend in the direction of extension of the long sides of the pixel electrode body 24A. The number and shape of the pixel overlapping openings 25A and a range in which the pixel overlapping openings 25A are formed may be changed properly to be different from those indicated in FIGS. 2 and 3. When the pixel electrode 24 is charged to create a potential difference between the pixel electrode 24 and the common electrode 25 overlapping each other, a component acting along a plate surface of the array substrate 21 as well as a fringe field (oblique field) including a component acting in the direction of a normal to the plate surface of the array substrate 21 develops between the openings edges of the pixel overlapping openings 25A and the pixel electrode 24. This fringe field is used to control a state of orientation of liquid crystal molecules included in the liquid crystal layer 22. In other words, the liquid crystal panel 11 according to this embodiment operates in fringe field switching (FFS) mode. The common electrode 25 forms the above touch electrodes 30. In addition to the above pixel overlapping openings 25A, the common electrode 25 also has a partition opening (partition slit) 25B that partitions touch electrodes 30 adjacent to each other. The partition opening 25B is composed of portions traversing across the whole length of the common electrode 25 in the X-axis direction and portions traversing across the whole length of the common electrode 25 in the Y-axis direction, thus being formed substantially into a latticed shape as a whole in a plan view. The partition opening 25B thus divides the common electrode 25 into check patterns in a plan view, providing the touch electrodes 30 electrically independent of each other that make up the common electrode 25. The touch lines 31 connected to the touch electrodes 30 thus supply common signals (reference potential signals) related to the display function and touch signals related to the touch function, to the touch electrodes 30 at different points of time, that is, in a time-division manner. The common signals are transmitted to all the touch lines 31 at the same points of time, giving all the touch electrodes 30 a reference potential to cause them to function as the common electrode 25.

Figure 5:
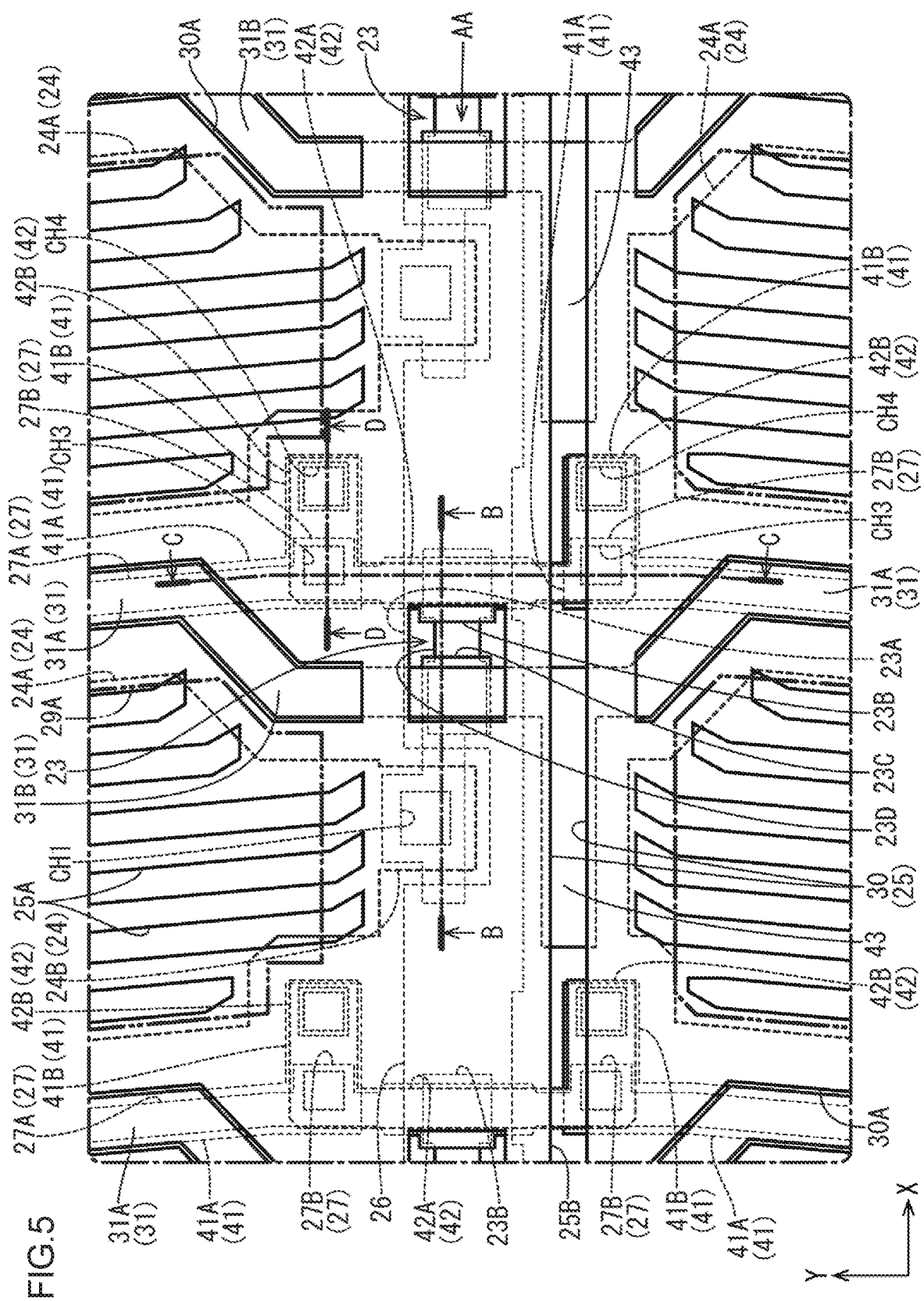
FIG. 5 is a plan view of the vicinity of a TFT in the array substrate and a CF substrate that make up the liquid crystal panel.

A configuration of the TFT 23 and that of the pixel electrode 24 will be described in detail, with reference to FIG. 5. FIG. 5 is an enlarged plan view of the vicinity of a given TFT 23 in the array substrate 21. As shown in FIG. 5, each TFT 23 is of a laterally elongated shape extending along the X-axis direction as a whole and is located below a pixel electrode 24 to be connected to the TFT 23 such that the TFT 23 is adjacent to the pixel electrode 24 in the Y-axis direction in FIG. 5. The TFT 23 has a gate electrode 23A formed of a part of a gate line 26, the part overlapping a source line 27. The gate electrode 23A is of a laterally elongated shape extending along the X-axis direction, drives the TFT 23 based on a scanning signal supplied to the gate line 26, thereby controls a current flowing between a source electrode 23B and a drain electrode 23C. The TFT 23 has the source electrode 23B formed of a part of the source line 27, the part overlapping the gate line 26. The source electrode 23B is located on one end side of the TFT 23 in the X-axis direction such that substantially the whole of the source electrode 23B overlaps the gate electrode 23A and that the source electrode 23B is connected to a channel 23D. The TFT 23 has the drain electrode 23C disposed in a location separated from the source electrode 23B across a gap, that is, located on the other end side of the TFT 23 in the X-axis direction. The drain electrode 23C substantially extends along the X-axis direction, and has one end overlapping the gate electrode 23A in a location counter to the source electrode 23B, the one end being connected to the channel 23D, and the other end connected to the pixel electrode 24.

As shown in FIG. 5, the pixel electrode 24 is composed of a pixel electrode body 24 of substantially a rectangle that overlaps a pixel opening 29A of the shading portion 29, and a contact 24B projecting from the pixel electrode body 24 toward the TFT 23 along the Y-axis direction. The contact 24B overlaps the other end of the drain electrode 23C, and the contact 24B and the other end of the drain electrode 23C that overlap each other are interconnected through a pixel contact hole CH1 bored on a first inter-layer insulating film 36. The gate line 26 has a cutout made by cutting out a part of gate line 26 that overlaps the contact 24B and the drain electrode 23C. This cutout is formed to reduce capacitance between the gate line 26 and the pixel electrode 24. The other end of the drain electrode 23C overlaps the gate line 26. This arrangement is made in order that even if the drain electrode 23C is shifted in position relative to the gate line 26 when the array substrate 21 is manufactured, it does not cause a change in capacitance between the gate line 26 and the drain electrode 23C (that is, capacitance between the gate line 26 and the pixel electrode 24). The TFT 23 has the channel 23D that overlaps the gate electrode 23A via a gate insulating film 33, which will be described later, and that is connected to the source electrode 23B and the drain electrode 23C. The channel 23D overlaps the gate electrode 23A, extends in the X-axis direction, and has one end connected to the source electrode 23B and the other end connected to the drain electrode 23C. When the TFT 23 is switched on based on a scanning signal supplied to the gate electrode 23A, an image signal (data signal) supplied to the source line 27 is sent from the source electrode 23B to the drain electrode 23C through the channel 23D made of a semiconductor film 34. As a result, the pixel electrode 24 is charged to have a potential based on the image signal. The common electrode 25 has a cutout made by cutting out a part of common electrode 25 that overlaps the channel 23D. This cutout is formed to suppress fluctuations in a leak current flowing between the source electrode 23B and the drain electrode 23C, the fluctuations in the leak current resulting from fluctuations in the potential of the common electrode 25 (touch electrode 30) that occur when the TFT 23 is off.

Figure 6:
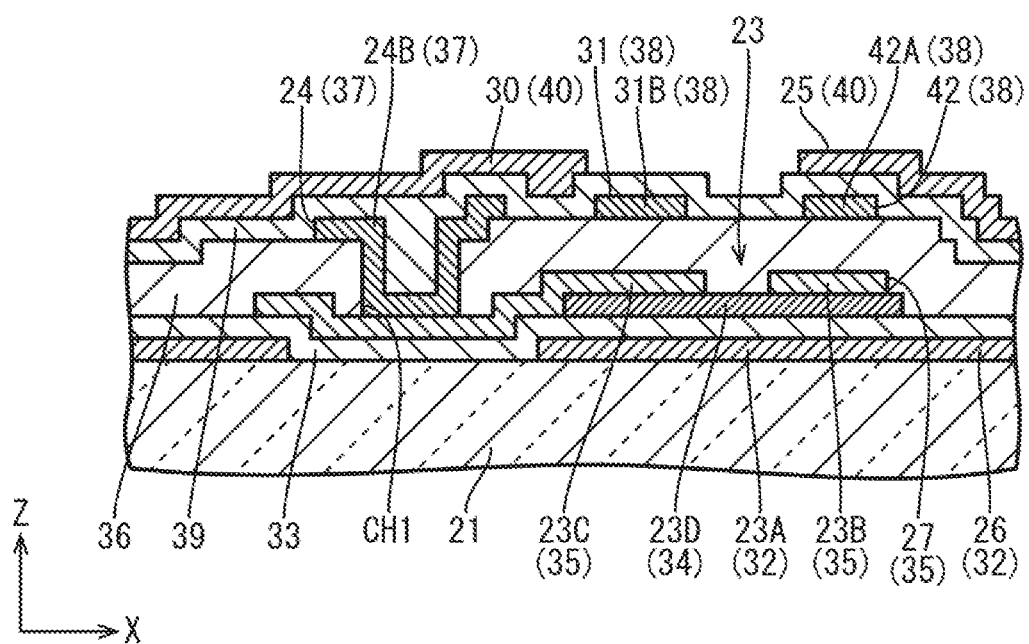
FIG. 6 is a sectional view of the array substrate of FIG. 5 that is taken along a B-B line in FIG. 5.

Various films stacked on the inner surface side of the array substrate 21 will be described with reference to FIG. 6. FIG. 6 is a sectional view of the vicinity of a TFT 23 of the liquid crystal panel 11. As shown in FIG. 6, the array substrate 21 includes a first metal film 32, the gate insulating film 33, a semiconductor film 34, a second metal film 35, the first inter-layer insulating film 36, a first transparent electrode film 37, a third metal film 38, a second inter-layer insulating film 39, and a second transparent electrode film 40 that are stacked in increasing order from the lower layer side (side closer to the glass substrate). Each of the first metal film 32, the second metal film 35, and the third metal film 38 is formed as a single film made of one metal material selected from copper, titanium, aluminum, molybdenum, and tungsten or as a stacked film or alloy made of metal materials of different kinds, thus having conductivity and shading property. The first metal film 32 makes up the gate lines 26, the gate electrodes 23A of the TFTs 23, and auxiliary lines 41, which will be described later. The second metal film 35 makes up the source lines 27 and the source electrodes 23B and drain electrodes 23C of the TFTs 23. The third metal film 38 makes up the touch lines 31 and the bridge lines 42, which will be described later. Each of the gate insulating film 33, the first inter-layer insulating film 36, and the second inter-layer insulating film 39 is made of an inorganic material, such as silicon nitride ($SiN_x$) and silicon oxide ($SiO_2$). The gate insulating film 33 keeps the first metal film 32, which is on the lower layer side to the gate insulating film 33, insulated from the semiconductor film 34 and the second metal film 35, which are on the upper layer side to the same. The first inter-layer insulating film 36 keeps the semiconductor film 34 and the second metal film 35, which are on the lower layer side to the first inter-layer insulating film 36, insulated from the first transparent electrode film 37 and the third metal film 38, which are on the upper layer side to the same. The second inter-layer insulating film 39 keeps the first transparent electrode film 37 and the third metal film 38, which are on the lower layer side to the second inter-layer insulating film 39, insulated from the second transparent electrode film 40, which is on the upper layer side to the same. The semiconductor film 34 is a thin film made of, for example, oxide semiconductor, amorphous silicon, and the like, and makes up the channels (semiconductor portions) 23D connected to the source electrodes 23B and drain electrodes 23C of the TFTs 23. The first transparent electrode film 37 and the second transparent electrode film 40 are made of a transparent electrode material, such as indium tin oxide (ITO) and indium zinc oxide (IZO). The first transparent electrode film 37 makes up the pixel electrodes 24. The first transparent electrode film 37 and the third metal film 38 are on the upper layer side to the first inter-layer insulating film 36 and are in the same layer. It can be said, therefore, that the pixel electrodes 24 formed of the first transparent electrode film 37 and the touch lines 31 and inter-line connections 41 formed of the third metal film 38 are in the same layer. The second transparent electrode film 40 makes up the common electrode 25 (touch electrodes 30). According to this embodiment, the touch lines 31 and the inter-line connections 41 are of a single-layer structure formed of the third metal film 38. The touch lines 31 and the inter-line connections 41, however, may be formed as a stacked layer structure formed of the first transparent electrode film 37 and the third metal film 38.

A configuration of the touch lines 31 in the display area AA will then be described with reference to FIGS. 2, 3, 5 and 6. As shown in FIGS. 2 and 3, the touch lines 31 are formed of the third metal film 38 and, in a plan view, overlap most of the source lines 27 formed of the second metal film 35, via the first inter-layer insulating film 36. This arrangement, in comparison with arrangement in which the touch lines as a whole do not overlap the source lines 27, reduces a space for arranging the touch lines 31 and the source lines 27, and is therefore preferable as arrangement for improving an open-area percentage. In this arrangement, short circuit between the touch lines 31 formed of the third metal film 38, the gate lines 26 formed of the first metal film 32, and the source lines 27 formed of the second metal film 35 is prevented as well because of the presence of the first inter-layer insulating film 36 interposed between these films. The touch lines 31 extend substantially along the Y-axis direction such that most of the touch lines 31 run parallel with the source lines 27, and are separated from but adjacent to a number of the pixel electrodes 24 in the X-axis direction, the pixel electrodes 24 being lined up along the Y-axis direction. In other words, both of the touch lines 31 and the source lines 27 overlapping them do not overlap the pixel electrodes 24. The touch lines 31 overlap all the source lines 27, respectively, and the number of the touch lines 31 provided matches the number of the source lines 27 provided. At spots where the touch lines 31 and the touch electrodes 30 to be connected thereto overlap, the touch lines 31 and the touch electrodes 30 are interconnected through touch line contact holes CH2 bored on the second inter-layer insulating film 39 (see FIG. 1).

More specifically, as shown in FIG. 2, each touch line 31 has source line overlapping portions (second line overlapping portions) 31A which overlap the source line 27, and source line non-overlapping portions (second line non-overlapping portions) 31B which do not overlap the source line 27 and lie astride respectively the gate lines 26. The source line overlapping portions 31A overlap most of the source line 27 other than parts of sourced line 27 that lie astride respectively the gate lines 26, the parts of sourced line 27 including parts making up the source electrodes 23B, respectively. The source line overlapping portions 31A are thus arranged such that the source line overlapping portions 31A and the gate lines 26 are lined up alternately in the Y-axis direction, and the number of the source line overlapping portions 31A making up a row is equal to the number of the gate lines 26 making up a row. In other word, in this arrangement, a gate line 26 is interposed between source line overlapping portions 31A adjacent to each other in the Y-axis direction, and a source line overlapping portion 31A is interposed between gate lines 26 adjacent to each other in the Y-axis direction. Each source line non-overlapping portion 31B is set offset in the X-axis direction to the part of source line 27 that lies astride each gate line 26. Lying astride the gate line 26, the source line non-overlapping portion 31B bridges two source line overlapping portions 31A arranged across the gate line 26. The source line non-overlapping portions 31B are arranged such the source line non-overlapping portions 31B and the source line overlapping portions 31A are lined up alternately in the Y-axis direction, and the number of the source line non-overlapping portions 31B making up a row is equal to the number of the source line overlapping portions 31A making up a row. In other word, in this arrangement, a source line overlapping portions 31A is interposed between source line non-overlapping portions 31B adjacent to each other in the Y-axis direction, and a source line non-overlapping portion 31B is interposed between source line overlapping portions 31A adjacent to each other in the Y-axis direction. The source line non-overlapping portions 31B lined up in the Y-axis direction are each set offset to the source line 27 to be on the left-hand side indicated in FIG. 2 in the X-axis direction. In a line in which a TFT 23 to be connected to a source line 27 in a certain column is located on the left-hand side indicated in FIG. 2 relative to the source line 27, therefore, the source line non-overlapping portions 31B overlaps a part of the TFT 23. Specifically, as shown in FIGS. 5 and 6, the source line non-overlapping portion 31B overlaps the drain electrode 23C of the TFT 23 but does not overlap the channel 23D of the same. If the source line non-overlapping portion 31B is disposed such that it overlaps the channel 23D of the TFT 23, it causes aback gate effect, raising a concern that a large off-leak current may be created in the TFT 23. As describe above, however, the source line non-overlapping portion 31B is disposed such that it does not overlap the channel 23D of the TFT 23. This suppresses the off-leak current that may be created in the TFT 23. In this arrangement, the source line non-overlapping portion 31B overlaps the drain electrode 23C making up the TFT 23, which contributes to a reduction in the space for line arrangement. In a line in which a TFT 23 to be connected to a source line 27 in a certain column is located on the right-hand side indicated in FIG. 2 relative to the source line 27, as shown in FIG. 2, the source line non-overlapping portion 31B is disposed between the source line 27 in the column and a TFT 23 and a pixel electrode 24 in a column that is on the left side in FIG. 2 to the column to which the source line 27 belongs.

Figure 7:
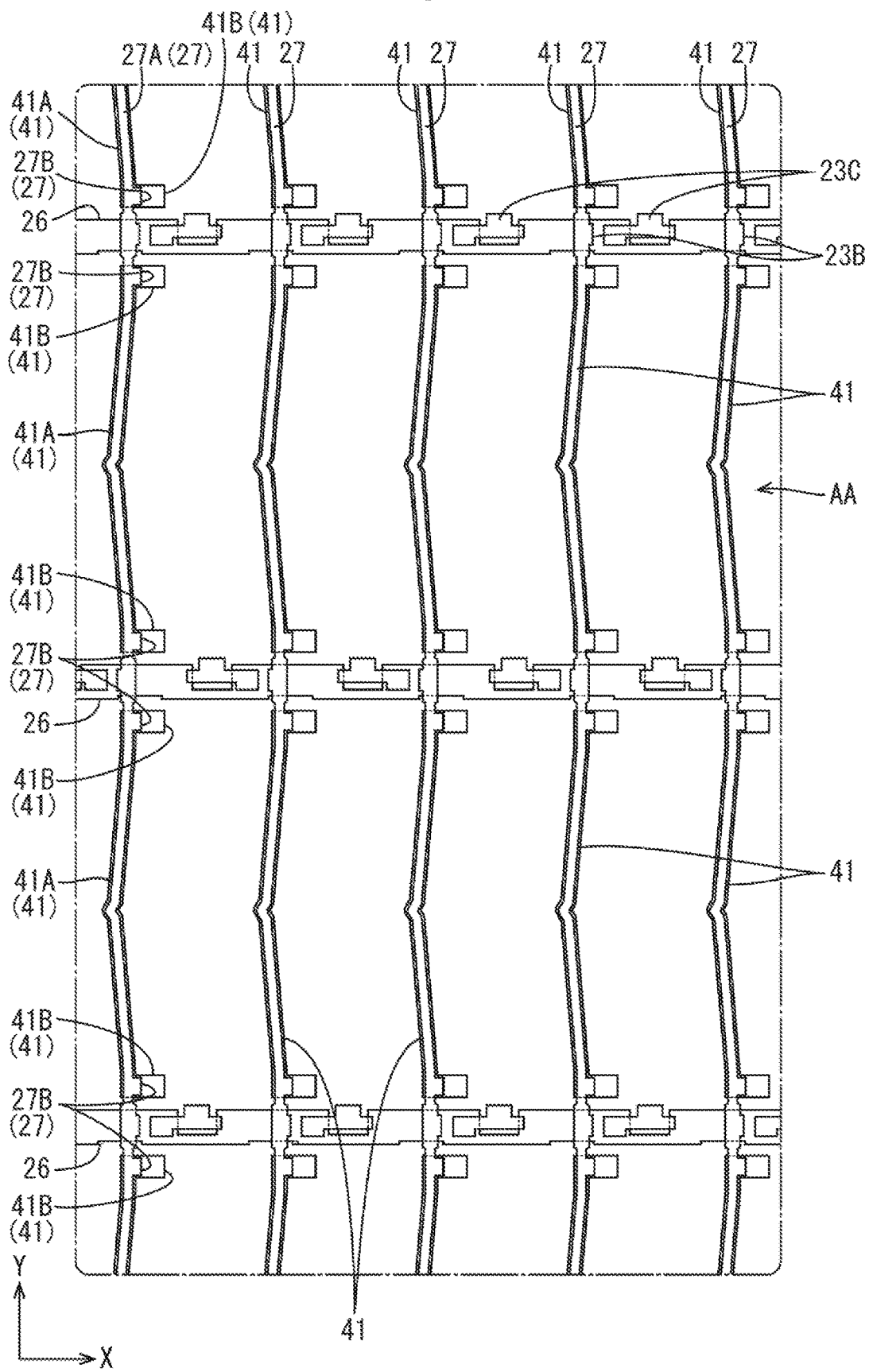
FIG. 7 is a plan view of a pattern of a first metal film and a second metal film included in the array substrate.

As shown in FIG. 2, the array substrate 21 according to this embodiment is provided with auxiliary lines 41 made of the first metal film 32, the auxiliary lines 41 being arranged such that each pair of auxiliary lines 41 sandwich each gate line 26 therebetween and that the auxiliary lines 41 overlap the source lines 27, and with bridge lines 42 made of the third metal film 38, the bridge lines 42 being arranged such that they lie astride the gate lines 26, respectively. These auxiliary lines 41 and bridge lines 42 are electrically connected to the source lines 27 made of the second metal film 35. This gives the source lines 27 a multi-line structure. A configuration of the auxiliary lines 41 will first be described with reference to FIGS. 2 and 7. FIG. 7 is a plan view of a pattern of the first metal film 32 and the second metal film 35 included in the array substrate 21. As shown in FIGS. 2 and 7, the auxiliary lines 41 extend substantially along the Y-axis direction in parallel with the source lines 27. The auxiliary lines 41 overlap most of the source line 27 other than parts of sourced line 27 that lie astride respectively the gate lines 26, the parts of sourced line 26 including parts making up the source electrodes 23B, respectively. Similar to the source line overlapping portions 31A making up the touch line 31, therefore, the auxiliary lines 41 are arranged such that the auxiliary lines 41 and the gate lines 26 are lined up alternately in the Y-axis direction, and the number of the auxiliary lines 41 making up a row is equal to the number of the source line overlapping portions 31A making up a row. In other word, in this arrangement, agate line 26 is interposed between auxiliary lines 41 adjacent to each other in the Y-axis direction, and an auxiliary line 41 is interposed between gate lines 26 adjacent to each other in the Y-axis direction. In this arrangement, the auxiliary lines 41, which are made of the same first metal film 32 making up the gate line 26, are prevented from being short-circuited to the gate line 26. The auxiliary lines 41 occupy a range in the Y-axis direction wider than a range occupied by the source line overlapping portions 31A making up the touchline 31. As a result, both ends of each auxiliary line 41 extend closer respectively to gate lines 26 than both ends of each source line overlapping portion 31A. The auxiliary lines 41 overlap substantially the whole of the source line overlapping portions 31A.

Figure 8:
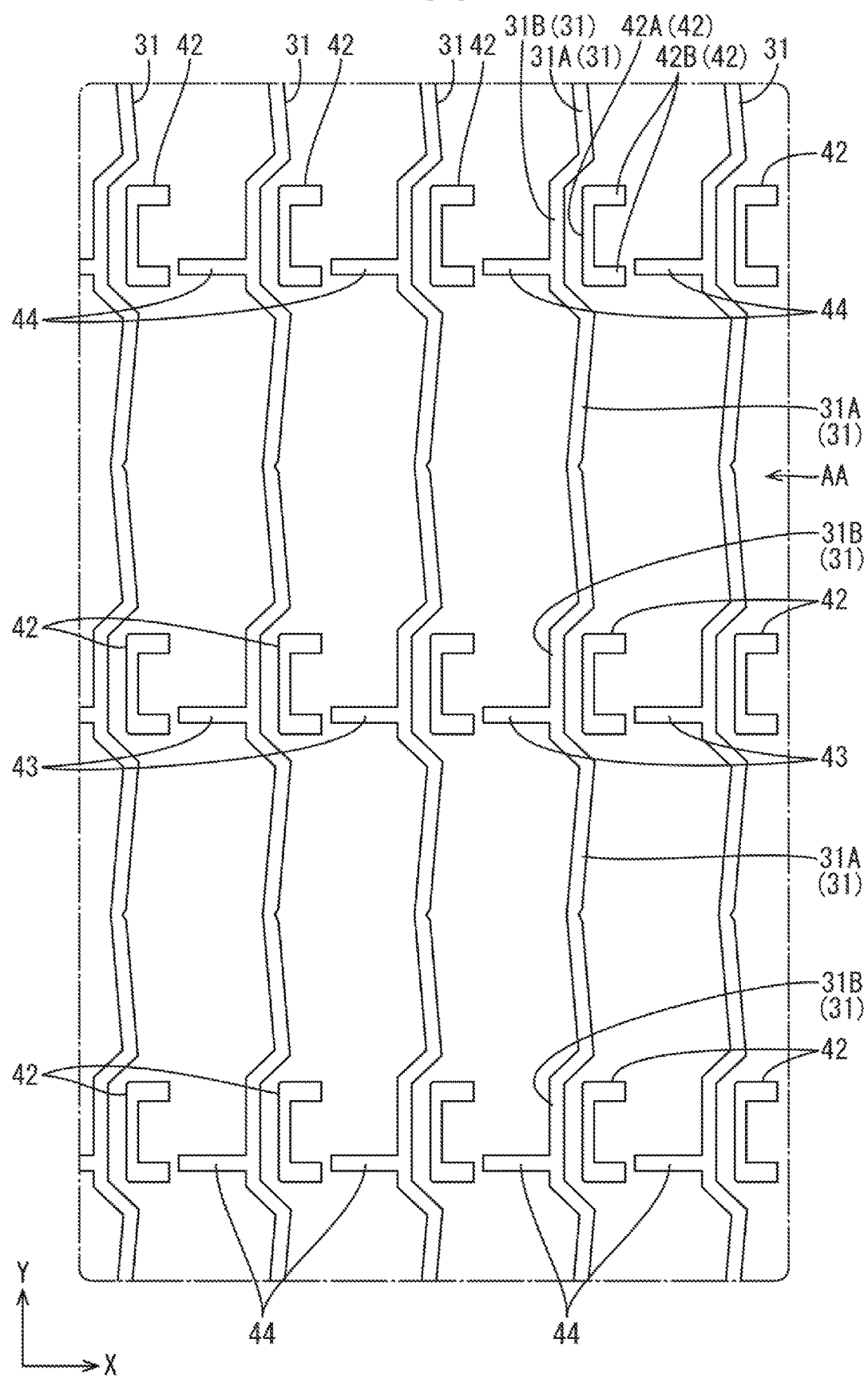
FIG. 8 is a plan view of a pattern of a third metal film included in the array substrate.

A configuration of the bridge lines 42 will then be described with reference to FIGS. 2 and 8. FIG. 8 is a plan view of a pattern of the third metal film 38 included in the array substrate 21. As shown in FIGS. 2 and 8, although each bridge line 42 lies astride each gate line 26, the bridge line 42 is made of the third metal film 38 and is therefore separated from the gate line 26 via the gate insulating film 33 and the first inter-layer insulating film 36 that are interposed between the bridge line 42 and the gate line 26. This prevents the bridge line 42 from being short-circuited to the gate line 26. The bridge line 42 lying astride the gate line 26 is connected to two auxiliary lines 41 arranged across the gate line 26 and to the source line 27. This connection structure will be described in detail in the next paragraph. The bridge line 42 has a bridge line body 42A that is a part lying astride the gate line 26. This bridge line body 42A runs parallel with the source line 27 and overlaps a part of source line 27 that lies astride the gate line 26. In this arrangement, in comparison with arrangement in which the bridge line body 42A does not overlap the source line 27, parasitic capacitance created between the source line 27 and bridge line 42 connected thereto and the gate line 26 is made small. This reduces load on the gate line 26 and the source line 27. In addition, the part where the bridge line 42 overlaps the source line 27 contributes to a reduction in the space for line arrangement and is therefore preferable as arrangement for improving the open-area percentage. The bridge lines 42 are arranged such that the bridge lines 42 and the auxiliary lines 41 are lined up alternately in the Y-axis direction, and the number of the bridge lines 42 making up a row is equal to the number of the auxiliary lines 41 making up a row. In other word, in this arrangement, an auxiliary line 41 is interposed between bridge lines 42 adjacent to each other in the Y-axis direction, and a bridge line 42 is interposed between auxiliary lines 41 adjacent to each other in the Y-axis direction.

Figure 9:
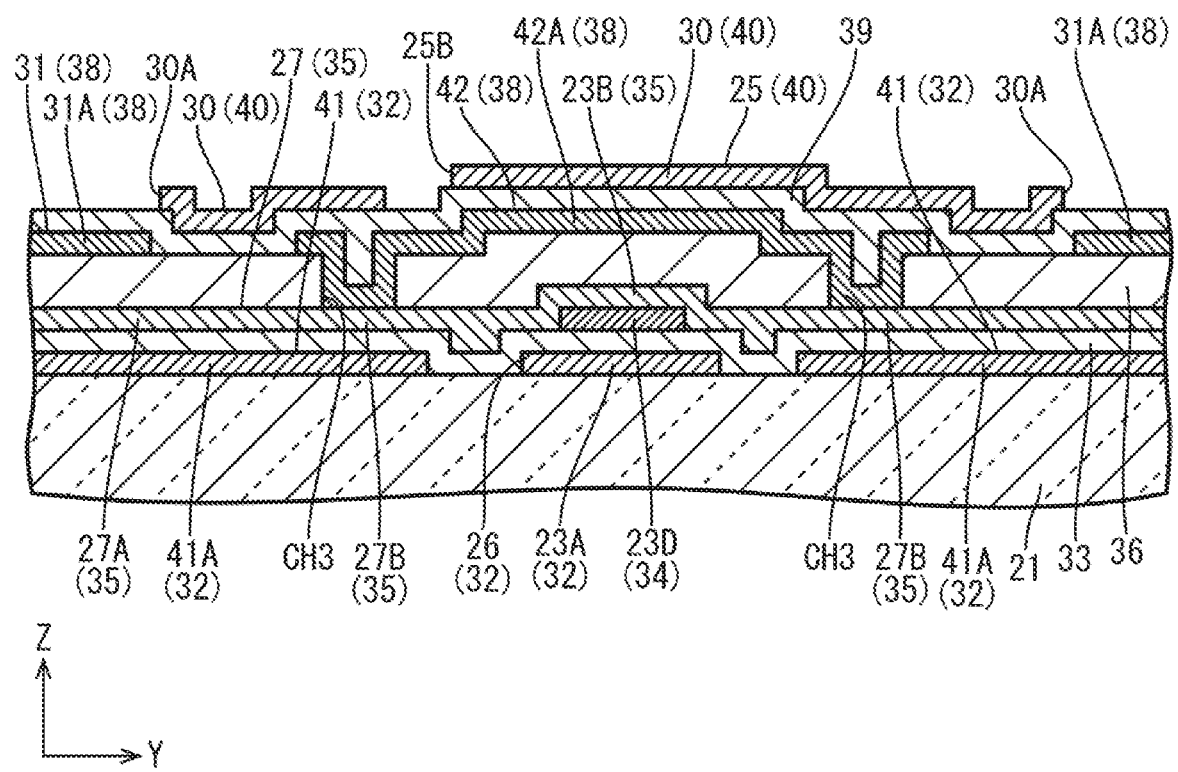
FIG. 9 is a sectional view of the array substrate of FIG. 5 that is taken along a C-C line in FIG. 5.
Figure 10:
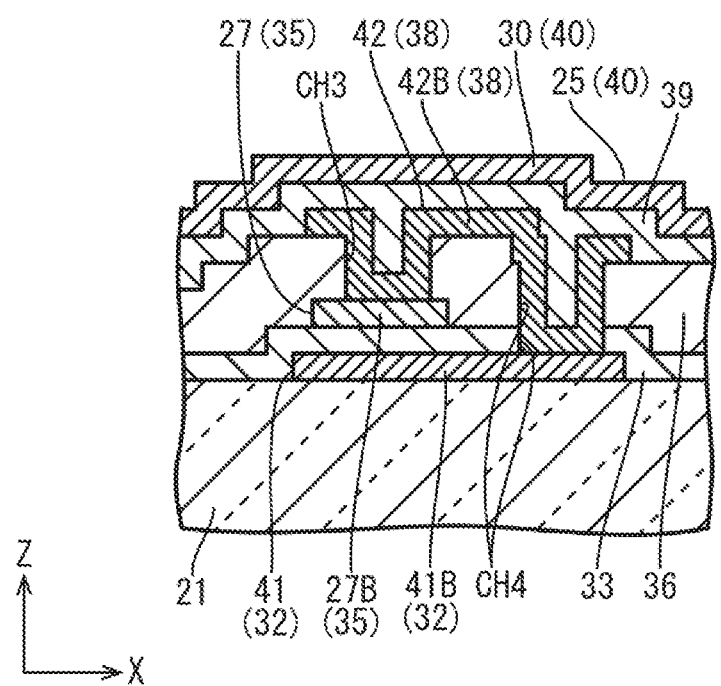
FIG. 10 is a sectional view of the array substrate of FIG. 5 that is taken along a D-D line in FIG. 5.

A connection structure in which the source line 27, the auxiliary line 41, and the bridge line 42 are connected will then be described with reference to FIGS. 5, 9, and 10. FIG. 9 is a sectional view of the bridge line 42 and the like included in the array substrate 21, the sectional view being taken by cutting the bridge line 42 and the like in the Y-axis direction. FIG. 10 is a sectional view of the bridge line 42 and the like included in the array substrate 21, the sectional view being taken by cutting the bridge line 42 and the like in the X-axis direction. As shown in FIG. 5, the auxiliary line 41 has an auxiliary line body 41A extending along the Y-axis direction and overlapping the source line 27, and a pair of auxiliary line side connection portions 41B projecting laterally along the X-axis direction respectively from both ends of the auxiliary line body 41A. The pair of auxiliary line side connection portions 41B each project to the right-hand side indicated in FIG. 5, i.e., the side opposite to the side on which the source line non-overlapping portion 31B set offset to the source line 27 lies, and are connected to the bridge line 42, which will be described later. In FIG. 5, the source line 27 has a source line body 27A extending along the Y-axis direction, and source line side connection portions 27B projecting laterally along the X-axis direction from a part of source line body 27A that does not overlap the touch line 31, i.e., a part of source line body 27A that lies astride the gate line 26. The source line side connection portions 27B project from the source line 27 to the right-hand side indicated in FIG. 5, i.e., the side to which the auxiliary line side connection portions 41B project, and are arranged in such a way as to overlap the pair of auxiliary line side connection portions 41B making up each auxiliary line 41. The source line side connection portions 27B are connected to the bridge line 42, which will be described later.

As shown in FIG. 5, the bridge line 42 has a bridge line body 42A extending along the Y-axis direction, the bridge line body 42A overlapping the source line 27 while lying astride the gate line 26, and a pair of bridge line side connection portions 42B projecting laterally along the X-axis direction from both sides of the bridge line body 42A. The pair of bridge line side connection portions 42B each project from the bridge line body 42A to the right-hand side indicate din FIG. 5, i.e., the side to which the auxiliary line side connection portions 41B and the source line side connection portions 27B project, and overlap the auxiliary line side connection portion 41B and the source line side connection portion 27B. The touch line 31 is routed in such a way as to bypass the bridge line side connection portions 42B, the auxiliary line side connection portions 41B, and the source line side connection portions 27B that overlap each other. In other words, the touch line 31 is disposed such that boundaries between the source line overlapping portions 31A and the source line non-overlapping portion 31B lie in locations that are offset in the Y-axis direction to the bridge line side connection portions 42B to be on the side opposite to the gate line 26. This prevents short circuit between the touch line 31 and the bridge line 42, which are made of the same third metal film 38. At spots where the bridge line side connection portions 42B of the bridge line 42 overlap the source line side connection portions 27B of the source line 27, first contact holes CH3 are formed respectively as openings penetrating the first inter-layer insulating film 36 interposed between the bridge line side connection portions 42B and the source line side connection portions 27B, as shown in FIG. 9. Through these first contact holes CH3, the bridge line side connection portions 42B made of the third metal film 38 are connected to the source line side connection portions 27B made of the second metal film 35. At spots where the bridge line side connection portions 42B of the bridge line 42 overlap the auxiliary line side connection portions 41B of the auxiliary line 41, second contact holes CH4 are formed respectively as openings penetrating the gate insulating film 33 and the first inter-layer insulating film 36, as shown in FIG. 10. Through these second contact holes CH4, the bridge line side connection portions 42B made of the third metal film 38 are connected to the auxiliary line side connection portions 41B made of the first metal film 32.

In the above manner, the bridge line 42 lying astride the gate line 26 electrically connect the source line 27 to the pair of auxiliary lines 41 sandwiching the gate line 26 therebetween, as shown in FIGS. 9 and 10. An image signal transmitted to the source line 27 is thus transmitted also to the pair of auxiliary lines 41 and to the bridge line 42. Thus, when the source line 27 is broken, the image signal can be transmitted through the pair of auxiliary lines 41 and the bridge line 42. This improves the redundant structure of the source line 27 and reduces the wiring resistance of the source line 27, in which case a voltage drop hardly occurs at the transmitted image signal. According to this embodiment, the array substrate 21 makes up the liquid crystal panel 11 having the image display function and the touch panel function as well. In the liquid crystal panel 11, because of the presence of the sensing period, a writing-in period for writing an image signal to a pixel electrode 24 is short. This short writing-in period leads to a tendency that a voltage drop at the image signal has a great effect on display quality. The above configuration, therefore, is effective for suppressing the deterioration of display quality. Because the pair of auxiliary lines 41 and the bridge line 42 are made of the first metal film 32 and the third metal film 38, respectively, the wiring resistance of the pair of auxiliary lines 41 and the bridge line 42 can be reduced, compared to a conventional case where an auxiliary repair line made of a transparent electrode film is used. This further ensures that a voltage drop hardly occurs at the image signal supplied to the pixel electrode 24. The pair of auxiliary lines 41 are made of the same first metal film 32 making up the gate line 26, and the bridge line 42 is made of the same third metal film 38 making up the touch line 31. This is preferable for reducing production costs. In addition, according to this embodiment, the source line 27 is connected indirectly to the auxiliary liens 41 via the bridge line 42. This eliminates a need of an additional production process or photo mask for forming contact holes on the gate insulating film 33 only, thus contributing preferably to production cost reduction. Further, the source line side connection portions 27B projecting laterally in the X-axis direction are provided. If the source line side connection portions are not provided and the source line is connected directly to the auxiliary line through contact holes bored on the gate insulating film 33, the source line enters the contact holes, causing a problem, such as film-breaking, in many cases. In the case of providing the source line side connection portions 27B, however, such a problem with the source line 27 hardly occurs and therefore the source line 27 is hardly broken. This further ensures that a voltage drop hardly occurs at the image signal supplied to the pixel electrode 24.

As shown in FIGS. 2 and 8, the touch line 31 routed in such a way as to bypass the bridge lines 42 is provided with shading portions 43 continuous with the touch line 31, the shading portions 43 being each arranged between touch electrodes 30 adjacent to each other in the Y-axis direction. The shading portion 43 is made of the same third metal film 38 making up the touch line 31 and is continuous with the source line non-overlapping portion 31B making up the touch line 31. As shown in FIG. 5, the shading portion 43 is sandwiched between a gate line 26 in a specific line among a number of the gate lines 26 and a pixel electrode 24 located on the lower side indicated in FIG. 5 relative to the gate line 26. In other words, the shading portion 43 is interposed between a specific gate line 26 and a pixel electrode 24 located opposite and adjacent in the Y-axis direction to a pixel electrode 24 to be connected to the specific gate line 26. The shading portion 43 is selectively disposed such that it is adjacent to the gate line 26 adjacent to a part of the partition opening 25B of the common electrode 25, the part extending in the X-axis direction. The shading portion 43 is made of the third metal film 38 and is therefore prevented from being short-circuited to the gate line 26 made of the first metal film 32. This improves a degree of freedom in disposing the shading portion 43 relative to the gate line 26. As a result, the shading portion 43 can be disposed extremely closer to the gate line 26 in the Y-axis direction. This prevents a case where the open-area percentage drops due to arrangement of the shading portions 43. From the source line non-overlapping portion 31B, the shading portion 43 extends along the X-axis direction in parallel with the gate line 26 such that a given gap is formed between the front end of the shading portion 43 and the bridge line side connection portion 42B of the bridge line 42. The shading portion 43 is disposed such that most of the shading portion 43 overlaps the part of the partition opening 25B of the common electrode 25, the part serving as a partition between the touch electrodes 30 adjacent to each other in the Y-axis direction and extending in the X-axis direction. In other words, most of the shading portion 43 does not overlap the touch electrodes 30. However, both side edges of shading portion 43 that extend along the X-axis direction slightly overlap the touch electrodes 30 adjacent to each other in the Y-axis direction, respectively. In this manner, disposing the shading portion 43 made of the third metal film 38 between the touch electrodes 30 adjacent to each other in the Y-axis direction allows the shading portion 43 to block leakage light that could develop when an electric field created between the common electrode 25 and the pixel electrode 24 becomes locally unstable between the touch electrodes 30 adjacent to each other in the Y-axis direction. This offers excellent display quality. In addition, the shading portion 43 continuous with the touch line 31, in comparison with a case where the shading portion 43 is separated from the touch line 31, exerts not only the shading function but also a function of blocking an electric field created between the gate line 26 adjacent to the shading portion 43 and the common electrode 25.

While on the one hand the shading portion 43 of the above configuration has the advantageous function of blocking an electric field created between the gate line 26 adjacent to the shading portion 43 and the common electrode 25, the shading portion 43 also has a disadvantage of creating parasitic capacitance between the shading portion 43 and the pixel electrode 24 adjacent to the shading portion 43, the pixel electrode 24 being located on the lower side indicated in FIG. 5 relative to the gate line 26. For this reason, if the shading portion 43 is selectively disposed only at the location between the touch electrodes 30 adjacent to each other among respective locations between sets of gate lines 26 and pixel electrodes 24 lined up in the Y-axis direction, capacitance created at a pixel electrode 24 adjacent to the shading portion 43 and capacitance created at a pixel electrode 24 not adjacent to the shading portion 43 becomes different from each other. This may lead to display irregularity. To prevent this problem, as shown in FIGS. 2 and 8, the array substrate 21 according to this embodiment is provided with dummy shading portions 44 each of which does not overlap the partition opening 25B of the common electrode 25, overlaps the touch electrode 30, and is continuous with the touch line 31. Each dummy shading portion 44 is sandwiched between each gate line 26 other than the gate lines 26 adjacent to the shading portions 43 and a pixel electrode 24 located on the lower side indicated in FIG. 5 relative to the gate line 26. In other words, the dummy shading portion 44 is disposed as an element that compensates a line in which no shading portion 43 is disposed. The dummy shading portion 44 is made of the same third metal film 38 making up the touch line 31, and is continuous with the source line non-overlapping portion 31B making up the touch line 31. The dummy shading portion 44 is sandwiched between the gate line 26 and a pixel electrode 24 located on the lower side indicated in FIG. 5 relative to the gate line 26. In other words, the dummy shading portion 44 is interposed between the gate line 26 and a pixel electrode 24 located opposite and adjacent in the Y-axis direction to a pixel electrode 24 to be connected to the gate line 26. From the source line non-overlapping portion 31B, the dummy shading portion 44 extends along the X-axis direction in parallel with the gate line 26 such that a given gap is formed between the front end of the dummy shading portion 44 and the bridge line side connection portion 42B of the bridge line 42. In this manner, the dummy shading portion 44 has a positional relation to the gate line 26 and the pixel electrode 24 that is equal to the positional relation of the shading portion 43 to the gate line 26 and the pixel electrode 24. In the above configuration, a pixel electrode 24 not adjacent to the shading portion 43 is adjacent to the dummy shading portion 44. As a result, a difference in parasitic capacitance hardly results between the pixel electrode 24 adjacent to the shading portion 43 and the pixel electrode 24 not adjacent to the shading portion 43 but adjacent to the dummy shading portion 44. Better display quality is therefore maintained.

As described above, the array substrate (wiring substrate) 21 according to this embodiment includes the gate lines (first lines) 26 made of the first metal film 32, the source lines (second lines) 27 made of the second metal film 35 disposed such that the gate insulating film (first insulating film) 33 is interposed between the second metal film 35 and the first metal film 32, the source lines 27 extending in such a way as to intersect the gate lines 26, the auxiliary lines 41 made of the first metal film 32, the auxiliary lines 41 being arranged such that a pair of auxiliary lines 41 sandwich each of the gate lines 26 therebetween and extending in parallel with the source lines 27 in such a way as to at least partly overlap the source lines 27, respectively, and bridge lines 42 made of the third metal film 38 disposed such that the first inter-layer insulating film (second insulating film) 36 located opposite to the gate insulating film 33 is interposed between the third metal film 38 and the second metal film 35, the bridge lines 42 being arranged in such a way as to lie astride the gate lines 26, respectively, to electrically connect the source lines 27 to pairs of the auxiliary lines 41.

In this configuration, the source lines 27, which intersect the gate lines 26 made of the first metal film 32, are made of the second metal film 35 disposed such that the gate insulating film 33 is interposed between the second metal film 35 and the first metal film 32. This prevents the source lines 27 from being short-circuited to the gate lines 26. The auxiliary lines 41, which are made of the same first metal film 32 making up the gate lines 26 and extend in parallel with the source lines 27 in such a way as to at least partly overlap the source lines 27, respectively, via the gate insulating film 33, are arranged such that a pair of auxiliary lines 41 sandwich each of the gate lines 26 therebetween. This prevents the auxiliary lines 41 from being short-circuited to the gate lines 26. The bridge lines 42, which are arranged in such a way as to lie astride the gate lines 26, respectively, are made of the third metal film 38 disposed such that the first inter-layer insulating film 36 located opposite to the gate insulating film 33 is interposed between the third metal film 38 and the second metal film 35. This prevents the bridge lines 42 from being short-circuited to the gate lines 26. Because each bridge line 42 electrically connects the source line 27 to a pair of auxiliary lines 41 sandwiching the gate line 26 therebetween, a signal transmitted to the source line 27 is transmitted also to the pair of auxiliary lines 41 and to the bridge line 42. Thus, even when the source line 27 is broken, signal transmission is maintained, which improves the redundant structure of the source line 27 and reduces the wiring resistance of the source line 27, in which case a voltage drop hardly occurs at the transmitted signal. Because the pair of auxiliary lines 41 and the bridge line 42 are made of the first metal film 32 and the third metal film 38, respectively, the wiring resistance of the pair of auxiliary lines 41 and the bridge line 42 can be reduced, compared to the conventional case where the auxiliary repair line made of the transparent electrode film is used. In addition, the pair of auxiliary lines 41 are made of the same first metal film 32 making up the gate line 26. This is preferable for reducing production costs.

The bridge line 42 partly overlaps the source line 27 via the first inter-layer insulating film 36 and partly overlaps the auxiliary line 41 via the gate insulating film 33 and the first inter-layer insulating film 36. The first inter-layer insulating film 36 has the first contact hole CH3 which is bored at the spot where the bridge line 42 and the source line 27 overlap to connect the bridge line 42 to the source line 27. The gate insulating film 33 as well as the first inter-layer insulating film 36 has the second contact hole CH4 which is bored at the spot where the bridge line 42 and the auxiliary line 41 overlap to connect the bridge line 42 to the auxiliary line 41. In this configuration, the part of bridge line 42 that overlaps the source line 27 is connected to the source line 27 through the first contact hole CH3 bored on the first inter-layer insulating film 36, while the part of bridge line 42 that overlaps the auxiliary line 41 is connected to the auxiliary line 41 through the second contact hole CH4 bored on the gate insulating film 33 and on the first inter-layer insulating film 36. In this manner, the source line 27 is connected indirectly to the auxiliary line 41 via the bridge line 42. This structure eliminates a need of an additional production process or photo mask for forming contact holes on the gate insulating film 33 only, thus contributing preferably to production cost reduction. If the source line is connected directly to the auxiliary line through contact holes bored on the gate insulating film 33, the source line enters the contact holes, easy to causing a problem, such as film-breaking, in many cases. In the above connection structure, however, such a problem with the source line 27 hardly occurs and therefore the source line 27 is hardly broken.

The array substrate 21 also includes the touch lines (third lines) 31 made of the third metal film 38, the touch lines 31 at least partly overlapping the source lines 27 in parallel therewith. In this configuration, the touch lines 31 at least partly overlap the source lines 27 in parallel therewith but are made of the third metal film 38 disposed such that the first inter-layer insulating film 36 is interposed between the third metal film 38 and the second metal film 35. This prevents the touch lines 31 from being short-circuited to the source lines 27. The touch lines 31 made of the same third metal film 38 making up the bridge lines 42 are preferable for production cost reduction.

Each touch line 31 has the source line overlapping portion (second line overlapping portion) 31A disposed in such a way as to overlap the source line 27, and the source line non-overlapping portion (second line non-overlapping portion) 31B disposed such that it does not overlap the source line 27 and lies astride the gate line 26 to bypass the part of bridge line 42 that overlaps the source line 27. In this configuration, the source line overlapping portion 31A of the touch line 31 is disposed in such a way as to overlap the source line 27. This reduces the space for line arrangement. The source line non-overlapping portion 31B of the touch line 31 is disposed such that it does not overlap the source line 27 and lies astride the gate line 26 to bypass the part of bridge line 42 that overlaps the source line 27. This prevents short circuit between the touch line 31 and the bridge line 42.

The array substrate 21 also includes the TFTs (switching elements) 23 each of which at least has the channel 23D made of the semiconductor material and is connected to the gate line 26 and to the source line 27. The source line non-overlapping portion 31B is disposed in such a way as not to overlap the channel 23D. If the source line non-overlapping portion 31B is disposed in such a way as to overlap the channel 23D of the TFT 23, it raises a concern that the back gate effect may create a large off-leak current at the TFT 23. However, as described above, the source line non-overlapping portion 31B is disposed in such a way as not to overlap the channel 23D of the TFT 23. This suppresses the off-leak current that could be created at the TFT 23.

The array substrate 21 includes the TFT 23 at least having the gate electrode 23A connected to the gate line 26, the source electrode 23B connected to the source line 27, the channel 23D made of the semiconductor material, the channel 23D having its one end connected to the source electrode 23B, and the drain electrode 23C connected to the other end of the channel 23D. The source line non-overlapping portion 31B is disposed in such a way as to overlap the source electrode 23B or the drain electrode 23C. In this configuration, when the TFT 23 is driven according to an incoming signal from the gate line 26, a signal supplied from the source line 27 to the TFT 23 travels from the source electrode 23B through the channel 23D made of the semiconductor to the drain electrode 23C. The source line non-overlapping portion 31B being disposed in such a way as to overlap the source electrode 23B or the drain electrode 23C contributes to a reduction in the space for line arrangement.

The array substrate 21 includes the TFT 23 connected to the gate line 26 and to the source line 27, the pixel electrode 24 connected to the TFT 23, the common electrode 25 at least partly overlapping the pixel electrode 24 via the second inter-layer insulating film (third insulating film) 39, and the touch electrodes (position detecting electrodes) 30 formed by dividing the common electrode 25, the touch electrodes 30 each creating capacitance between the touch electrode 30 and the position input object by which position input is made and detecting the position of input made by the position input object. In this configuration, the pixel electrode 24 is charged by the TFT 23 driven according to signals supplied to the gate line 26 and the source line 27. Between the pixel electrode 24 and the common electrode 25 at least partly overlapping the pixel electrode 24 via the second inter-layer insulating film 39, a potential difference based on a potential of the pixel electrode 24 charged by the TFT 23 could be created. An image is displayed using such a potential difference. Each of the touch electrodes 30 formed by dividing the common electrode 25 creates capacitance between the touch electrode 30 and the position input object, by which position input is made, and detects the position of input made by the position input object. The array substrate 21 includes also the shading portion 43 disposed between touch electrodes 30 adjacent to each other in the direction of extension of the source line 27, the shading portion 43 being made of the first metal film 32, the second metal film 35, or the third metal film 38. Between the touch electrodes 30 adjacent to each other in the direction of extension of the source line 27, light leakage may occur when an electric field created between the common electrode 25, i.e., touch electrode 30, and the pixel electrode 24 becomes locally unstable. The shading portion 43, which is made of the first metal film 32, the second metal film 35, or the third metal film 38 and is disposed between the touch electrodes 30 adjacent to each other in the direction of extension of the source line 27, blocks leakage light to hardly allow light from leaking between the touch electrodes 30 adjacent to each other in the direction of extension of the source line 27. In addition, the shading portion 43 can also block an electric filed that could be created between the gate line 26 and the common electrode 25.

The shading portion 43 is made of the third metal film 38 according to this embodiment. If the shading portion 43 is made of the first metal film 32, it is necessary to separate the shading portion 43 from the gate line 26 across a given gap in order to avoid short circuit between the shading portion 43 and the gate line 26. This may lead to a drop in the open-area percentage. However, the shading portion 43 is made of the third metal film 38 disposed such that the gate insulating film 33 and the first inter-layer insulating film 36 are interposed between the third metal film 38 and the first metal film 32. This improves a degree of freedom in disposing the shading film 43 relative to the gate line 26, thus preventing a case where the open-area percentage drops due to arrangement of the shading portion 43.

The shading portion 43 is continuous with the touch line 31. In this configuration, the shading portion 43 is allowed to exert not only the shading function but also the function of blocking an electric field that could be created between the gate line 26 adjacent to the shading portion 43 and the common electrode 25.

Sets of the gate lines 26 and the pixel electrodes 24 are lined up in the direction of extension of the source line 27. In this arrangement, the TFT 23 is connected to a pixel electrode 24 adjacent thereto, the pixel electrode 24 being on one side relative to the gate line 26, and the shading portion 43 is disposed between the gate line 26 and a pixel electrode 24 adjacent thereto, the pixel electrode 24 being on the others side relative to the gate line 26. The array substrate 21 further includes the dummy shading portion 44 which is disposed between a gate line 26 different from the gate line 26 adjacent to the shading portion 43 in the direction of extension of the source line 27 and a pixel electrode 24 adjacent to the dummy shading portion 44, the pixel electrode 24 being on the other side relative to the gate line 26, such that the dummy shading portion 44 overlaps the touch electrode 30, is made of the third metal film 38, and is continuous with the touch line 31. While on the one hand the shading portion 43 has the advantageous function of blocking an electric field created between the gate line 26 adjacent to the shading portion 43 and the common electrode 25, the shading portion 43 also has a disadvantage of creating parasitic capacitance between the shading portion 43 and the pixel electrode 24 adjacent to the shading portion 43, the pixel electrode 43 being on the other side relative to the gate line 26. For this reason, if the shading portion 43 is disposed only at the location between the touch electrodes 30 adjacent to each other among respective locations between sets of gate lines 26 and pixel electrodes 24 lined up in the direction of extension of the source line 27, parasitic capacitance created at a pixel electrode 24 adjacent to the shading portion 43 and parasitic capacitance created at a pixel electrode 24 not adjacent to the shading portion 43 becomes different from each other. This may lead to display irregularity. To deal with this problem, the dummy shading portion 44 made of the third metal film 38 and continuous with the touch line 31 is disposed between the gate line 26 different from the gate line 26 adjacent to the shading portion 43 in the direction of extension of the source line 27 and the pixel electrode 24 adjacent to the dummy shading portion 44, the pixel electrode 24 being on the other side relative to the gate line 26, such that the dummy shading portion 44 overlaps the touch electrode 30. This arrangement puts the pixel electrode 24 not adjacent to the shading portion 43 adjacent to the dummy shading portion 44. As a result, a difference in parasitic capacitance hardly results between the pixel electrode 24 adjacent to the shading portion 43 and the pixel electrode 24 not adjacent to the shading portion 43 but adjacent to the dummy shading portion 44. Better display quality is therefore maintained.

The bridge line 42 is disposed such that its part lying astride the gate line 26 overlaps the source line 27. In this configuration, in comparison with a case where the part of bridge line 42 that lies astride the gate line 26 does not overlap the source line 27, parasitic capacitance that could be created between the source line 27 and bridge line 42 connected thereto and the gate line 26 is made small. This reduces load on the gate line 26 and the source line 27.

The liquid crystal panel (display device) 11 according to this embodiment includes the above described array substrate (wiring substrate) 21 and the CF substrate (counter substrate) 20 disposed counter to the array substrate 21. The liquid crystal panel 11 having this configuration reduces the wiring resistance of the source line 27, thus offering excellent display quality.

Second Embodiment

A second embodiment will be described with reference to FIGS. 11 to 16. In the second embodiment, a bridge line 142 and a shading portion 143 provided by changing the configuration of the bridge line 42 and the shading portion 43 will be described. The same structures and effects as described in the first embodiment will not be described repeatedly.

Figure 11:
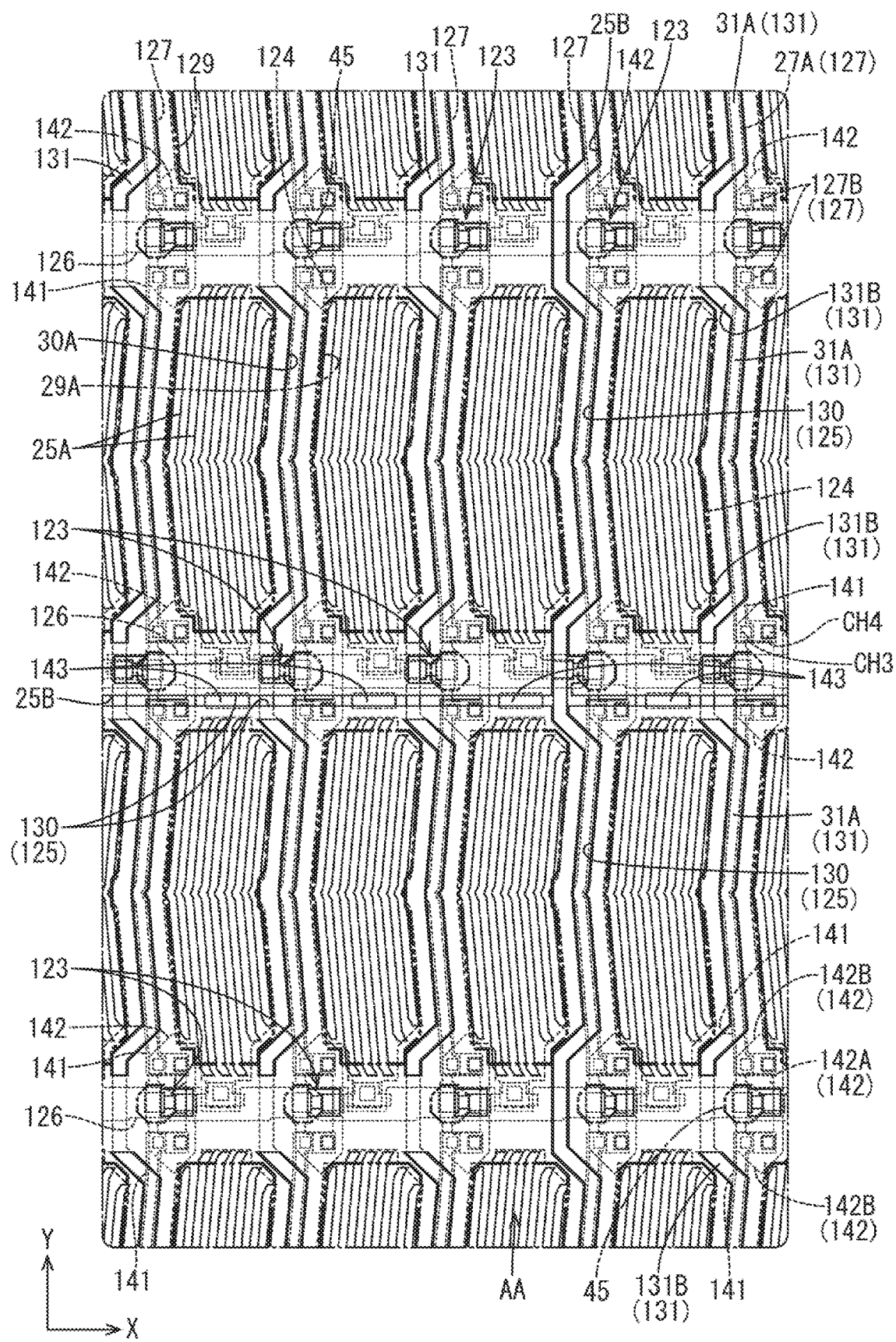
FIG. 11 is a plan view of arrangement of pixels of a liquid crystal panel according to a second embodiment.
Figure 12:
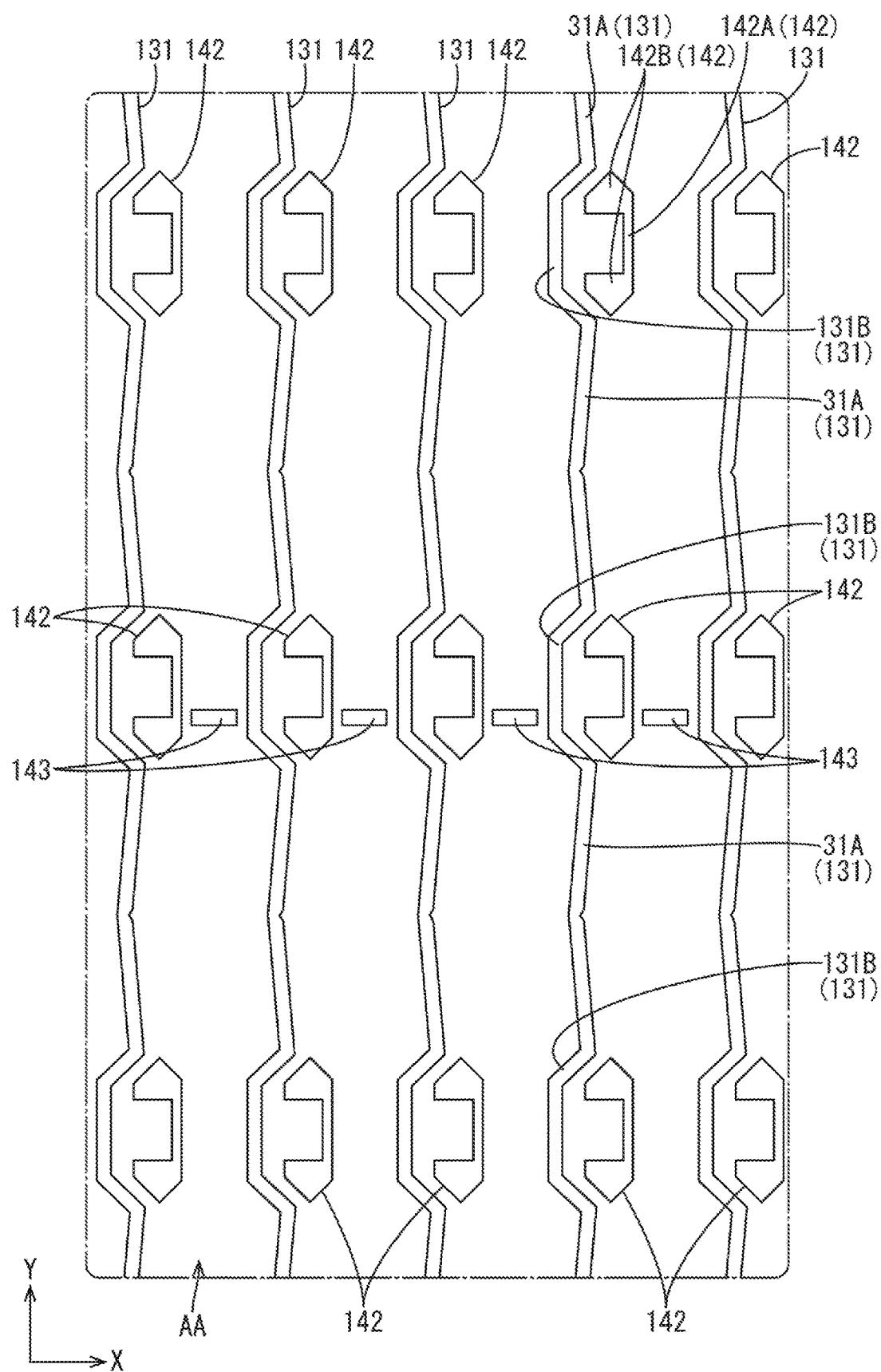
FIG. 12 is a plan view of a pattern of the third metal film included in the array substrate.

As shown in FIGS. 11 and 12, the shading portion 143 according to the second embodiment is separated from a touch line 131. Specifically, the shading portion 143 is made of a third metal film 138, which is the same film making up the touch line 131, but is separated from a source line non-overlapping portion 131B of the touch line 131. In the same manner as the shading portion 143 of the first embodiment is disposed between touch electrodes adjacent to each other, the shading portion 143 is disposed between touch electrodes 130 adjacent to each other in the Y-axis direction and is therefore can block leakage light that could develop between the touch electrodes adjacent to each other when an electric field created between a common electrode 125 and a pixel electrode 124 becomes locally unstable. The shading portion 143 is interposed between a specific gate line 126 and a pixel electrode 124 in a plan view. According to the first embodiment, because the shading portion 43 is continuous with the touch line 31, the shading portion 43 exerts the function of blocking an electric field that could be created between the gate line 26 adjacent to the shading portion 43 and the common electrode 25 but creates capacitance between the shading portion 43 and a specific pixel electrode 124 adjacent to the shading portion 43. This may lead to display irregularity (see FIG. 5). To prevent such a case, according to the first embodiment, the dummy shading portion is provided such that it is adjacent to a pixel electrode 24 not adjacent to the shading portion 43 and is continuous with the touch line 31. However, when the dummy shading portion continuous with a touch line 31 not to be connected to the touch electrode 30 overlaps the touch electrode 30, large parasitic capacitance is created between the touch electrode 30 and the touch line 31 not to be connected to the touch electrode 30. This parasitic capacitance may lead to the deterioration of sensitivity to touches. According to the second embodiment, however, the shading portion 143 is separated from the touch line 131, in which case the shading portion 143 has no function of blocking an electric field that could be created between the gate line 126 adjacent to the shading portion 143 and the common electrode 125 but creation of parasitic capacitance between the shading portion 143 and the specific pixel electrode 124 adjacent to the shading portion 143 can be avoided. This prevents display irregularity caused by arrangement of the shading portions 143, thus making unnecessary providing the dummy shading portion such that it is adjacent to a pixel electrode 124 not adjacent to the shading portion 143. The deterioration of sensitivity to touches caused by arrangement of the shading portions 143, therefore, can be avoided.

Figure 13:
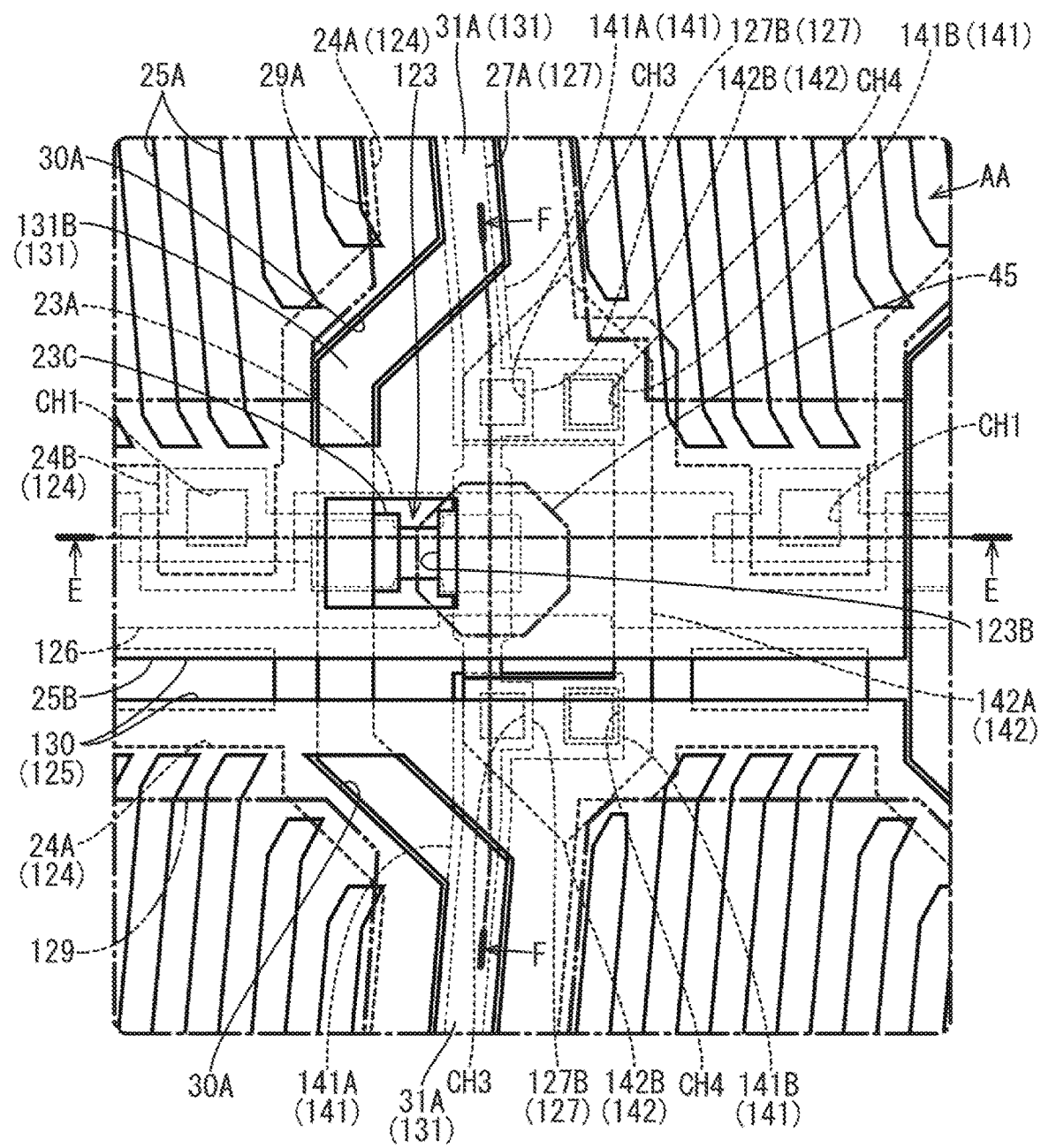
FIG. 13 is a plan view of the vicinity of a TFT in the array substrate and the CF substrate that make up the liquid crystal panel.

As shown in FIGS. 11 and 12, the bridge line 142 according the second embodiment is disposed such that abridge line body 142A extending in the Y-axis direction does not overlap a source line 127. Specifically, as shown in FIG. 13, the bridge line body 142A making up the bridge line 142 is set offset in the X-axis direction to the source line 127 toward the side opposite to the source line non-overlapping portion 131B (right-hand side indicated in FIG. 13). At every bridge line 142, the bridge line body 142A is disposed in this manner. As a result, a location at which the gate line 126 intersects the source line 127, a location at which the gate line 126 intersects the touch line 131, and a location at which the gate line 126 intersects the bridge line 142 are offset to each other in the X-axis direction. A pair of bridge line side connection portions 142B making up the bridge line 142 project in the X-axis direction from both sides of the bridge line body 142A toward the source line 127, and overlap a source line side connection portion 127B of the source line 127 and an auxiliary line side connection portion 141B of an auxiliary line 141, respectively. The bridge line 142 configured in this manner and the source line non-overlapping portion 131B of the touch line 131 jointly form an annular shape. Near the center of this circular shape, the location at which the gate line 126 intersects the source line 127 (a source electrode 123B of a TFT 123) is present.

Figure 14:
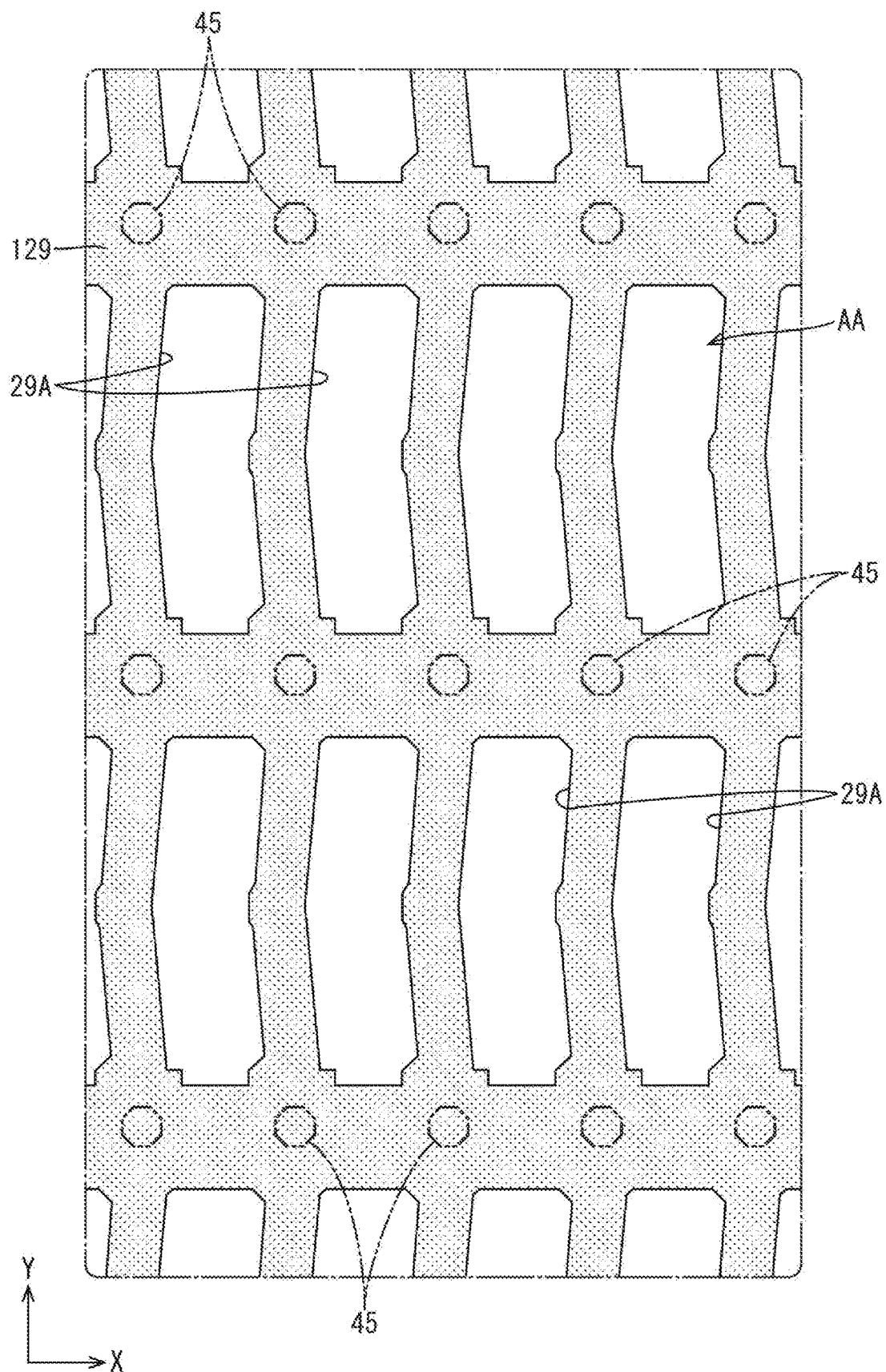
FIG. 14 is a plan view of a pattern of a black matrix and spacers included in the CF substrate.
Figure 15:
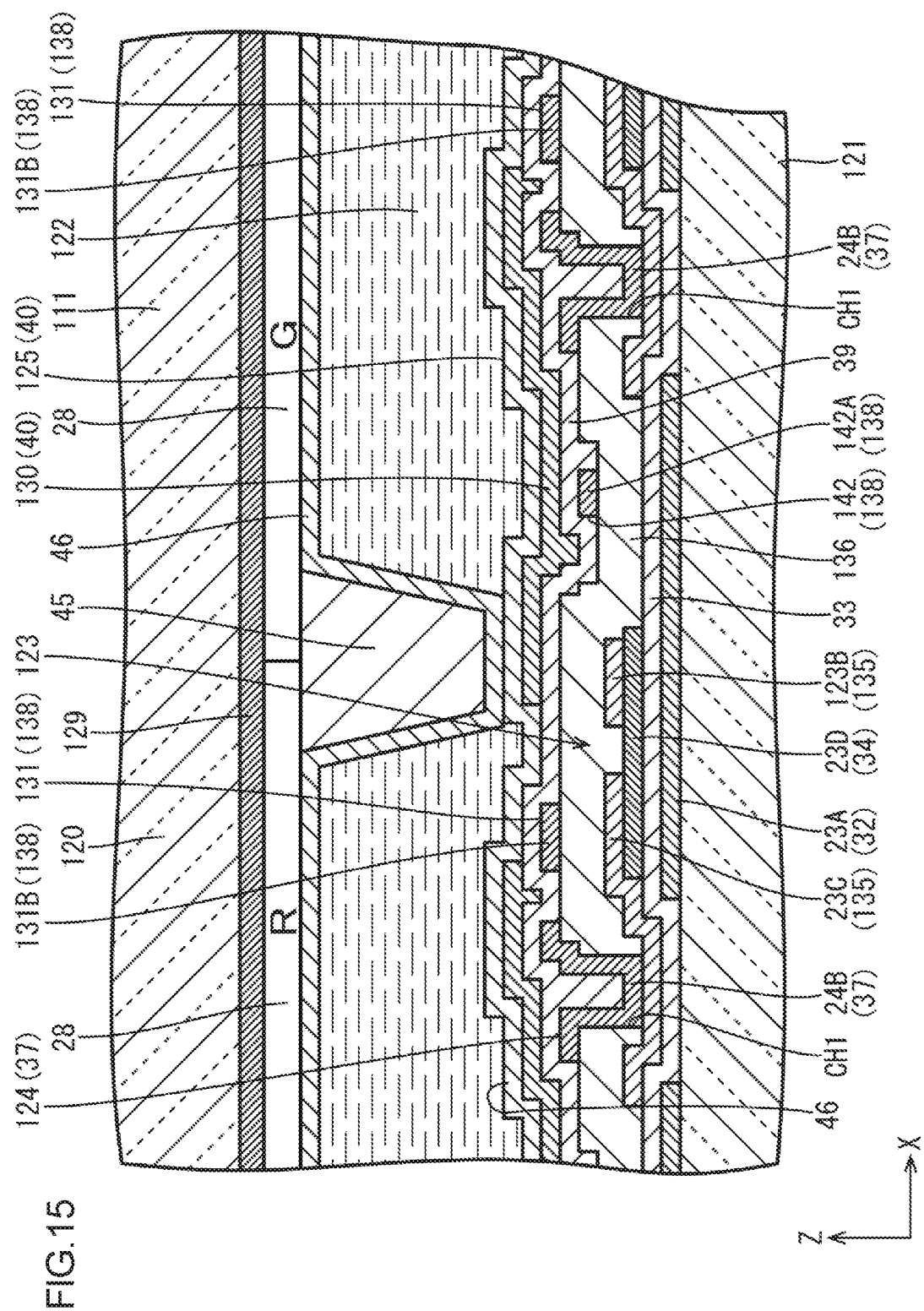
FIG. 15 is a sectional view of the liquid crystal panel of FIG. 13 that is taken along an E-E line in FIG. 13.
Figure 16:
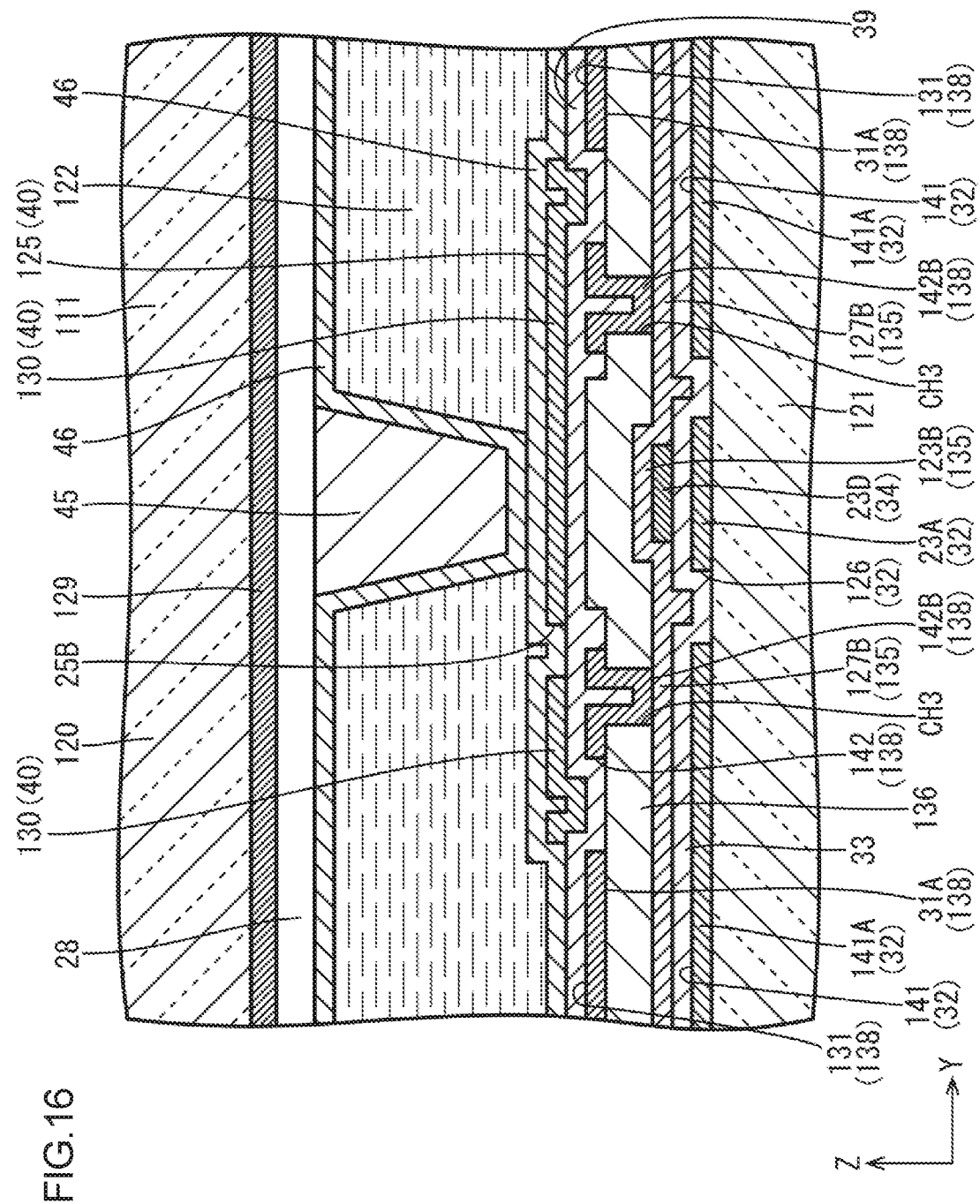
FIG. 16 is a sectional view of the liquid crystal panel of FIG. 13 that is taken along an F-F line in FIG. 13.

As shown in FIGS. 14 to 16, a CF substrate 120 is provided with spacers (inter-substrate holders) 45 that are interposed between the CF substrate 120 and an array substrate 121 to hold a gap between both substrates 120 and 121. Each spacer 45 is made of, for example, a photosensitive resin material and is formed substantially into a column with a given length that projects from the surface of the CF substrate 120 toward the array substrate 121, with the front end face of the projecting column being in contact with the inner surface of the array substrate 121. The inner surfaces of the CF substrate 120 and the array substrate 121, the inner surfaces facing a liquid crystal layer 122, are overlaid respectively with orientation films 46. In a plan view, the spacers 45 are arranged respectively near the centers of intersections of a black matrix 129 formed into a latticed pattern on the CF substrate 120, and are therefore put in plane arrangement in which the spacers 45 overlap locations at which the gate lines 126 intersect the source lines 127 in the array substrate 121. The spacers 45, therefore, overlap the gate lines 126 and the source lines 127 included in the array substrate 121 but do not overlap the touch lines 131 and the bridge lines 142. Each spacer 45 is encircled with the source line non-overlapping portion 131B and the bridge line 142 that jointly form the annular shape. The spacer 45 has the front end face of its projecting shape in direct contact with the orientation film 46 overlaid on the inner surface of the array substrate 121. For this reason, for example, when either the substrate 120 or the substrate 121 subjected to an external force deforms, the spacer 45 slides over the orientation film 46 and may chip it to produce debris. These debris of the orientation film 46 may possibly be visually recognized as minute luminescent point flaws. However, as described above, the spacer 45 is encircled with the source line non-overlapping portion 131B and the bridge line 142 that jointly form the annular shape, and these source line non-overlapping portion 131B and bridge line 142 block leakage light that could result from the debris of the orientation film 46 that are produced by the spacer 45. This ensures an improvement in display quality.

As described above, according to this embodiment, the touch electrodes 130 are lined up in the direction of extension of the source lines 127, the touch lines 131 are arranged such that groups of touch lines 131 are connected to groups of touch electrodes 130, and the shading portions 143 are separated from the touch lines 131. In this configuration, the touch lines 131 supply signals for position detection and signals for image display to the touch electrodes 130 in a time-division manner. Each shading portion 143 separated from the touch line 131 loses its function of blocking an electric filed but offers the advantage described below. If the shading portion is continuous with the touch line 131, the shading portion exerts the function of blocking an electric filed but creates parasitic capacitance between the shading portion and a specific pixel electrode 124 adjacent to the shading portion, thus raising a concern that display irregularity may occur. One way to avoid such display irregularity is to provide a dummy shading portion adjacent to a pixel electrode 124 not adjacent to the shading portion and to join the dummy shading portion to the touch line 131 to make the dummy shading portion continuous with the touch line 131. However, if the dummy shading portion continuous with a touch line 131 not to be connected to the touch electrode 130 overlaps the touch electrode 130, large parasitic capacitance is created between the touch electrode 130 and the touch line 131 not to be connected to the touch electrode 130. This parasitic capacitance may lead to the deterioration of position detection sensitivity. However, separating the shading portion 143 from the touch line 131 prevents a case where parasitic capacitance is created between the shading portion 143 and the specific pixel electrode 124 adjacent to the shading portion 143. This makes unnecessary providing the dummy shading portion such that it is adjacent to the pixel electrode 124 not adjacent to the shading portion 143.

A liquid crystal panel 111 according to this embodiment includes the touch lines 131 formed in the array substrate 121, the touch lines 131 being made of the third metal film 138 and at least partly overlapping the source lines 127 in parallel therewith, and the spacers 45 that are interposed between the array substrate 121 and the CF substrate 120 to hold the gap between the array substrate 121 and the CF substrate 120. The touch line 131 and the bridge line 142 are arranged such that respective parts of the touch line 131 and bridge line 142, the parts lying astride the gate line 126, encircle the spacer 45 without overlapping the spacer 45. In this configuration, the spaces 45 are interposed between the array substrate 121 and the CF substrate 120 to hold the gap between the array substrate 121 and the CF substrate 120. The touch lines 131 at least partly overlap the source lines 127 in parallel therewith but are made of the third metal film 138 disposed such that the first inter-layer insulating film 136 is interposed between the third metal film 138 and the second metal film 135. This prevents the touch lines 131 from being short-circuited to the source lines 127. The touch lines 131 made of the same third metal film 138 making up the bridge lines 142 are preferable for production cost reduction. The touch line 131 and the bridge line 142, which are equally made of the third metal film 138, are arranged such that respective parts of the touch line 131 and bridge line 142, the parts lying astride the gate line 126, encircle the spacer 45 without overlapping the spacer 45. The touch line 131 and bridge line 142 thus block leakage light that could be caused by the spacer 45. This ensures an improvement in display quality.

Third Embodiment

A third embodiment will be described with reference to FIG. 17 or 18. In the third embodiment, a shading portion 243 provided by changing the configuration of the shading portion 243 of the first embodiment will be described. The same structures and effects as described in the first embodiment will not be described repeatedly.

Figure 17:
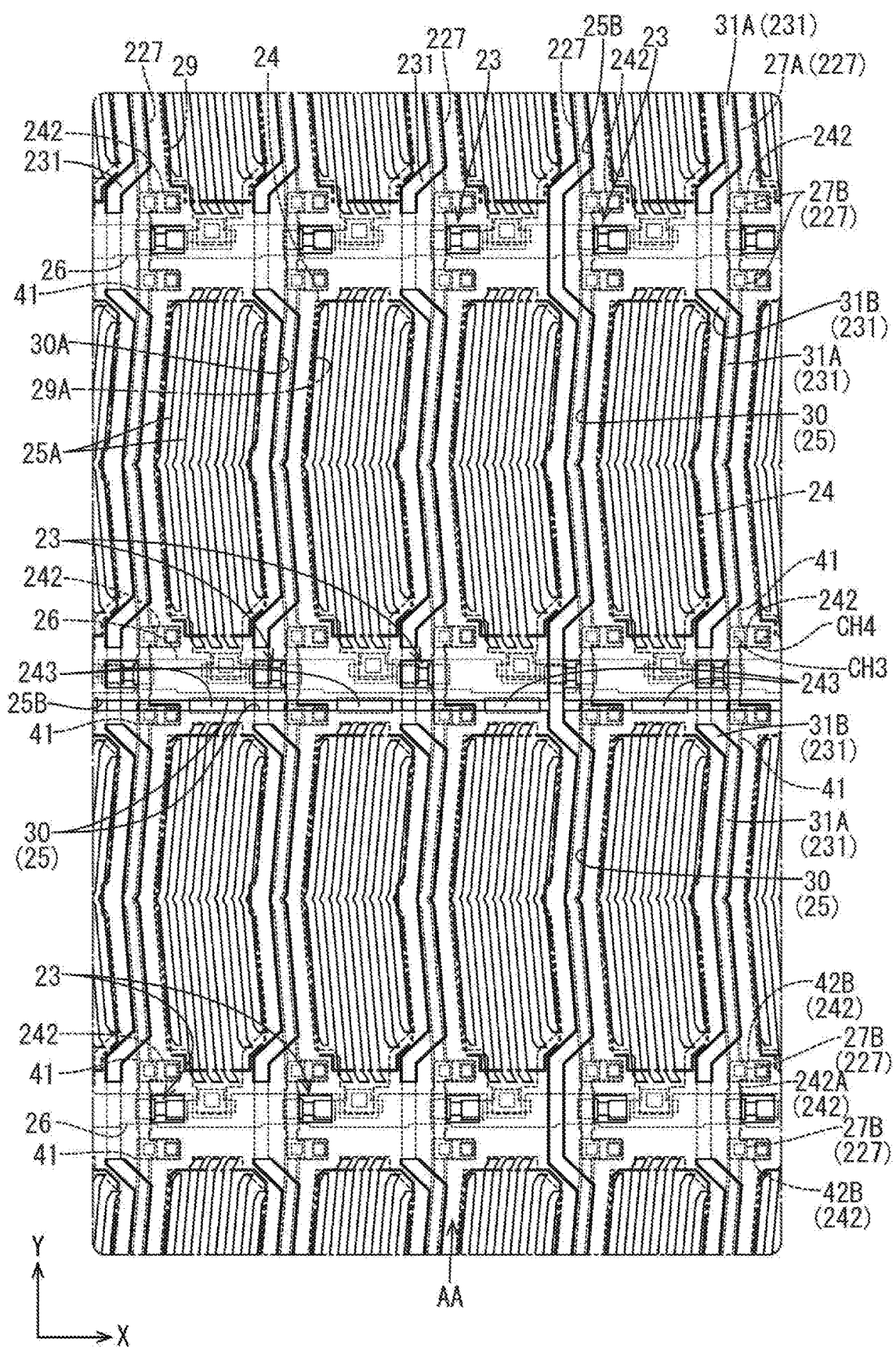
FIG. 17 is a plan view of arrangement of pixels of a liquid crystal panel according to a third embodiment.
Figure 18:
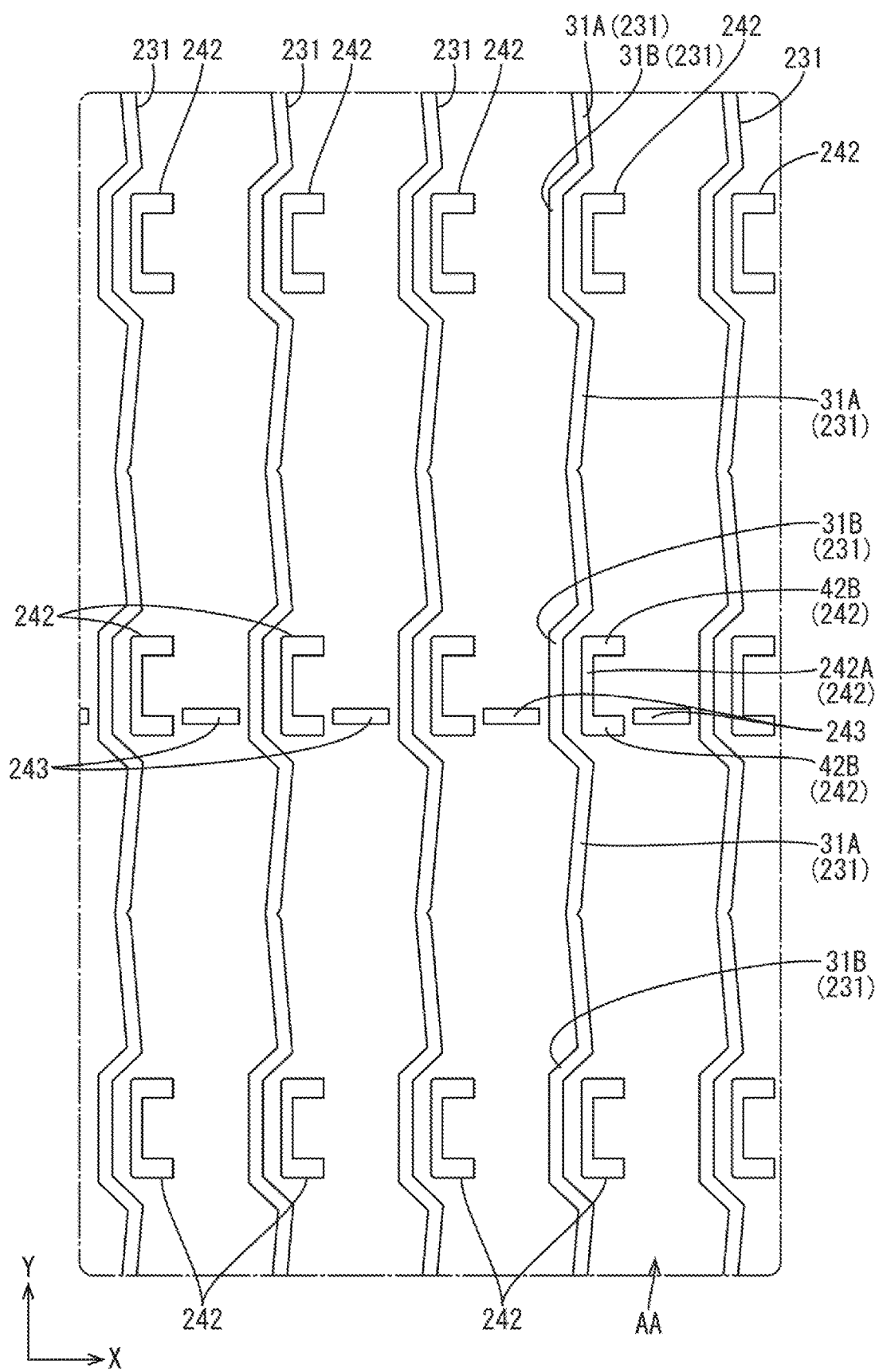
FIG. 18 is a plan view of a pattern of the third metal film included in the array substrate.

As shown FIGS. 17 and 18, the shading portion 243 according to the third embodiment is separated from a touch line 231 in the same manner as the shading portion 243 of the second embodiment is separated from the touch line 231. A specific configuration of the shading portion 243 and effects achieved by the shading portion 243 are the same as the configuration of the shading portion 243 and the effects achieved by the shading portion 243 as described in the second embodiment. The third embodiment offers a configuration in which a bridge line body 242A of a bridge line 242 overlaps a source line 227 in the same manner as the bridge line body 242A of the bridge line 242 overlaps the source line 227 in the first embodiment but the shading portion 243 is separated from the touch line 231. In this configuration, providing a dummy shading portion is unnecessary.

Other Embodiments

The technology described herein is not limited to the embodiments described above with reference to the drawings. The following embodiments may be included in the technical scope.

(1) The above embodiments are described as the configuration in which the bridge line is connected to the source line and to the auxiliary line. However, another configuration may also be adopted in which the auxiliary line is connected to the source line and to the bridge line. In such a configuration, specifically, the auxiliary line at least partly overlaps the source line via the gate insulating film and partly overlaps the bridge line as well via the gate insulating film and the first inter-layer insulating film, as the gate insulating film has the first contact hole which is bored at the spot at which the auxiliary line overlaps the source line to connect the auxiliary line to the source line and the gate insulating film as well as the first inter-layer insulating film has the second contact hole which is bored at the spot at which the auxiliary line overlaps the bridge line to connect the auxiliary line to the bridge line.

(2) When the configuration described in (1) is adopted, it is preferable that the auxiliary line have the auxiliary line body overlapping the source line, and the auxiliary line side connection portion projecting laterally from the auxiliary line body to overlap a part of the bridge line. The bridge line may be disposed such that the bridge line as a whole does not overlap the source line.

(3) The above embodiments are described as the configuration in which the bridge line is connected to the source line and to the auxiliary line. However, another configuration may also be adopted in which the source line is connected to the auxiliary line and to the bridge line. In such a configuration, specifically, the source line at least partly overlaps the auxiliary line via the gate insulating film and partly overlaps the bridge line as well via the first inter-layer insulating film, as the gate insulating film has the first contact hole which is bored at the spot at which the source line overlaps the auxiliary line to connect the source line to the auxiliary line and the first inter-layer insulating film has the second contact hole which is bored at the spot at which the source line overlaps the bridge line to connect the source line to the bridge line. It is preferable that the source line have a pad that projects laterally along the X-axis direction to overlap an end of the bridge line.

(4) When the configuration described in (3) is adopted, it is preferable that the source line have the source line body overlapping the auxiliary line, and the source line side connection portion projecting laterally from the source line body to overlap a part of the bridge line. The bridge line may be disposed such that the bridge line as a whole does not overlap the auxiliary line.

(5) The above embodiments are described as the configuration in which the touch line has the source line non-overlapping portion. However, another configuration may also be adopted in which the touch line overlaps the source line body in the length substantially equivalent to the whole length of the touch line and has no source line non-overlapping portion. In such a configuration, the bridge line made of the same third metal film making up the touch line is disposed such that the bridge line does not overlap the source line body. It is preferable that the source line have the source line side connection portion projecting laterally from the source line body such that the source line side connection portion does not overlap the touch line but overlaps a part of the bridge line.

(6) The above embodiments are described as the configuration in which the shading portion is made of the third metal film. However, the shading portion may be made of the first metal film or second metal film. Similarly, the dummy shading portion described in the first embodiment may be made of the first metal film or second metal film.

(7) The second embodiment is described as the configuration in which the shading portion is separated from the touch line as the source line non-overlapping portion of the touch line and the bridge line jointly encircle the spacer. However, in the configuration in which the source line non-overlapping portion of the touch line and the bridge line jointly encircle the spacer, the shading portion may be continuous with the touch line. In such a case, it is preferable that the dummy shading portion continuous with the touch line be provided in the same manner as in the first embodiment.

(8) The second embodiment is described as the configuration in which the bridge line body of the bridge line does not overlap the source line as the source line non-overlapping portion of the touch line and the bridge line jointly encircle the spacer. However, in the configuration in which the source line non-overlapping portion of the touch line and the bridge line jointly encircle the spacer, the bridge line body of the bridge line may overlap the source line. In such a case, the spacer is set offset in the X-axis direction to the source line.

(9) The second embodiment is described as the configuration in which the spacer is disposed at the location at which the gate line intersects the source line. This plane arrangement of the spacer may be changed properly.

(10) The above embodiments are described as the configuration in which the source line non-overlapping portions making up the touch line are uniformly set offset toward one side in the X-axis direction relative to the source line. However, the source line non-overlapping portions making up the touch line may be arranged in a zigzag pattern such that the source line non-overlapping portions are set offset toward one side and the other side alternately in the X-axis direction relative to the source line. In such a case, all the source line non-overlapping portions are uniformly arranged in locations where the source line non-overlapping portions overlap respectively the drain electrodes of the TFTs or in locations where the source line non-overlapping portions do not overlap the drain electrodes of the TFTs.

(11) When the configuration described in (10) is adopted, it is preferable that, to prevent the bridge lines lined up along the Y-axis direction from interfering with the source line non-overlapping portions, the bridge lines be arranged in a zigzag pattern such that they are set offset toward one side and the other side alternately in the X-axis direction relative to the source line.

(12) The above embodiments are described as the configuration in which as a part of the source line body of the source line makes up the source electrode, the source line non-overlapping portion of the touch line overlaps the drain electrode of the TFT. However, for example, in a configuration in which the source electrode is formed to project laterally from the source line body of the source line, the source line non-overlapping portion of the touch line may be disposed in such a way as to overlap the source electrode of the TFT.

(13) The screen size and resolution of the liquid crystal panel, as specified in the above embodiments, may be changed properly.

(14) The pitch of arrangement of pixels in the liquid crystal panel, as specified in the above embodiments, may be changed properly.

(15) The above embodiments are described as the case where four drivers are mounted on the array substrate. The number of drivers mounted on the array substrate, however, can be change properly.

(16) The above embodiments are described as the case where the array substrate is provided with the gate circuit. However, the array substrate may dispense with the gate circuit and be provided with a gate driver having the same function as the function of the gate circuit. It may also possible that the gate circuit is mounted on one side of the array substrate only.

(17) The plane shape of the pixel overlapping openings of the common electrode, as specified in the above embodiments, may be changed properly. The pixel overlapping openings may be V-shaped or linear in their plane shapes. The number and the pitch of arrangement of the pixel overlapping openings provided may be changed properly.

(18) The above embodiments are described as the case where the TFTs are arranged in a zigzagged pattern on the array substrate in a plan view. The TFTs, however, may be arranged in a matrix pattern in a plan view.

(19) The above embodiments are described as the case where the shading portions are included in the CF substrate. The shading portions, however, may be included in the array substrate.

(20) The semiconductor film making up the channel of the TFT may be made of a material different from the materials specified in the above embodiments. For example, the semiconductor film may be made of polysilicon. In such a case, it is preferable that the TFT be of a bottom gate structure or a top gate structure in which a shading film is provided on the lower layer side to the channel (side on which the backlight unit is disposed).

(21) The above embodiments are described as the case where the touch panel pattern detects a touch by the self-capacitance method. The touch panel pattern, however, may detect a touch by a mutual-capacitance method.

(22) In the above embodiments, the transmissive liquid crystal panel is described. The technology described herein, however, may also be applied to a reflective liquid crystal panel and a semi-transmissive liquid crystal panel.

(23) The above embodiments are described as the case where the liquid crystal display device (liquid crystal panel, backlight unit) has a plane shape of a laterally elongated rectangle. The plane shape of the liquid crystal display device, however, may be a longitudinally elongated rectangle, a square, a circle, a semi-circle, an ellipse, a trapezoid, and the like.

The invention claimed is:

1. A wiring substrate comprising:
a first line made of a first metal film;
a second line made of a second metal film disposed such that a first insulating film is interposed between the second metal film and the first metal film, the second line extending in such a way as to intersect the first line;
auxiliary lines made of the first metal film, the auxiliary lines being arranged to sandwich the first line therebetween and extending in parallel with the second line in such a way as to at least partly overlap the second line; and
a bridge line made of a third metal film disposed such that a second insulating film located opposite to the first insulating film is interposed between the third metal film and the second metal film, the bridge line being arranged in such a way as to lie astride the first line to electrically connect the second line to the auxiliary lines, wherein
the bridge line partly overlaps the second line via the second insulating film and partly overlaps one of the auxiliary lines via the first insulating film and the second insulating film, and
the second insulating film has a first contact hole that is bored at a spot at which the bridge line overlaps the second line to connect the bridge line to the second line, while the first insulating film as well as the second insulating film has a second contact hole that is bored at a spot at which the bridge line overlaps the one of the auxiliary lines to connect the bridge line to the one of the auxiliary lines.

2. The wiring substrate according to claim 1, comprising a third line made of the third metal film, the third line at least partly overlapping the second line in parallel with the second line.

3. The wiring substrate according to claim 2, wherein the third line includes:
a second line overlapping portion disposed in such a way as to overlap the second line; and
a second line non-overlapping portion disposed such that, to bypass a spot at which the bridge line overlaps the second line, the second line non-overlapping portion lies astride the first line without overlapping the second line.

4. The wiring substrate according to claim 3, further comprising a switching element at least including a channel made of a semiconductor, the switching element being connected to the first line and to the second line, wherein
the second line non-overlapping portion is disposed in such way as not to overlap the channel.

5. The wiring substrate according to claim 3, further comprising a switching element at least including:

a gate electrode connected to the first line;
a source electrode connected to the second line;
a channel made of a semiconductor, the channel having one end connected to the source electrode; and
a drain electrode connected to another end of the channel, wherein
the second line non-overlapping portion is disposed in such way as to overlap the source electrode or the drain electrode.

6. The wiring substrate according to claim 2, further comprising:
a switching element connected to the first line and to the second line;
a pixel electrode connected to the switching element;
a common electrode disposed in such a way as to at least partly overlap the pixel electrode via a third insulating film; and
a plurality of position detection electrodes formed by dividing the common electrode, the position detection electrodes creating capacitance between the position detection electrodes and a position input object by which position input is made and detecting a position of input made by the position input object.

7. The wiring substrate according to claim 6, further comprising a shading portion disposed between the position detection electrodes adjacent to each other in a direction of extension of the second line, the shading portion being made of the first metal film, the second metal film, or the third metal film.

8. The wiring substrate according to claim 7, wherein the shading portion is made of the third metal film.

9. The wiring substrate according to claim 8, wherein the shading portion is continuous with the third line.

10. The wiring substrate according to claim 9, wherein
the first line and the pixel electrode form a set and sets of first lines and pixel electrodes are lined up in a direction of extension of the second line as the switching element is connected to the pixel electrode adjacent to the switching element, the pixel electrode being on one side relative to the first line, and the shading portion is disposed between the first line and the pixel electrode adjacent to the shading portion, the pixel electrode being on the other side relative to the first line, and
the wiring substrate further includes a dummy shading portion disposed between the first line different from the first line adjacent to the shading portion in the direction of extension of the second line and the pixel electrode adjacent to the dummy shading portion, the pixel electrode being on the other side relative to the first line, such that the dummy shading portion overlaps the position detection electrode, the dummy shading portion being made of the third metal film and continuous with the third line.

11. The wiring substrate according to claim 8, wherein
the position detection electrode includes a plurality of position detection electrodes and the third line includes a plurality of third lines and the plurality of position detection electrodes are lined up in a direction of extension of the second line, and the plurality of third lines are arranged such that the third lines are connected to the position detection electrodes, and
the shading portion is separated from each of the third lines.

12. The wiring substrate according to claim 1, wherein the bridge line is disposed such that a part of the bridge line, the part lying astride the first line, overlaps the second line.

13. A display device comprising:
the wiring substrate according to claim 1; and
a counter substrate disposed counter to the wiring substrate.

14. A display device comprising:
a wiring substrate including:
a first line made of a first metal film;
a second line made of a second metal film disposed such that a first insulating film is interposed between the second metal film and the first metal film, the second line extending in such a way as to intersect the first line;
auxiliary lines made of the first metal film, the auxiliary lines being arranged to sandwich the first line therebetween and extending in parallel with the second line in such a way as to at least partly overlap the second line;
a bridge line made of a third metal film disposed such that a second insulating film located opposite to the first insulating film is interposed between the third metal film and the second metal film, the bridge line being arranged in such a way as to lie astride the first line to electrically connect the second line to the auxiliary lines; and
a third line made of the third metal film and at least partly overlapping the second line in parallel with the second line;
a counter substrate disposed counter to the wiring substrate; and
a spacer that is interposed between the wiring substrate and the counter substrate to hold a gap between the wiring substrate and the counter substrate, wherein
the third line and the bridge line are arranged such that respective parts of the third line and the bridge line, the parts lying astride the first line, jointly encircle the spacer without overlapping the spacer.

* * * * *